(12) United States Patent
Iida et al.

(10) Patent No.: US 9,135,857 B2
(45) Date of Patent: Sep. 15, 2015

(54) PIXEL CIRCUIT AND DISPLAY DEVICE, AND A METHOD OF MANUFACTURING PIXEL CIRCUIT

(71) Applicant: Sony Corporation, Tokyo (JP)

(72) Inventors: Yukihito Iida, Kanagawa (JP); Akitsuna Takagi, Aichi (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/611,746

(22) Filed: Feb. 2, 2015

(65) Prior Publication Data

US 2015/0213759 A1 Jul. 30, 2015

Related U.S. Application Data

(63) Continuation of application No. 14/447,670, filed on Jul. 31, 2014, now Pat. No. 8,976,089, which is a continuation of application No. 13/426,865, filed on Mar. 22, 2012, now Pat. No. 8,836,617, which is a continuation of application No. 11/979,308, filed on Nov. 1, 2007, now Pat. No. 8,188,941.

(30) Foreign Application Priority Data

Nov. 17, 2006 (JP) .................. 2006-311495

(51) Int. Cl.
 *G09G 3/30* (2006.01)
 *G09G 3/32* (2006.01)
 (Continued)

(52) U.S. Cl.
 CPC .............. *G09G 3/3233* (2013.01); *G09G 3/007* (2013.01); *H01L 27/3262* (2013.01); *H01L 27/3276* (2013.01); *H01L 29/458* (2013.01); *H01L 29/495* (2013.01); *H01L 29/4908* (2013.01); *H01L 29/78678* (2013.01);
 (Continued)

(58) Field of Classification Search
 CPC ..... G09G 3/30; G09G 3/3208; G09G 3/3233; G09G 2330/02; G09G 2330/021
 USPC ........................ 345/76–83, 92–100, 204–215
 See application file for complete search history.

(56) References Cited

U.S. PATENT DOCUMENTS 8,188,941 B2   5/2012   Iida et al.
8,760,372 B2   6/2014   Iida et al.
(Continued)

FOREIGN PATENT DOCUMENTS

JP   08-234683 A    9/1996
JP   2003-271095 A  9/2003
(Continued)

OTHER PUBLICATIONS

Japanese Office Action issued Dec. 2, 2008 for corresponding Japanese Application No. 2006-311495.

*Primary Examiner* — Vijay Shankar
(74) *Attorney, Agent, or Firm* — Fishman Stewart Yamaguchi PLLC

(57) ABSTRACT

The display device including a pixel circuit has a first line, a transistor, a light emitting element, and a second line. The transistor is located between the second line and an electrode of the light emitting element. Either the first line or the second line is wired in a region that overlaps a light emitting region of the light emitting element in a lamination direction of layers. The second line intersects the first line outside of the light emitting region and overlaps a non-light emitting region of the light emitting element.

9 Claims, 24 Drawing Sheets

(51) Int. Cl.
*G09G 3/00* (2006.01)
*H01L 27/32* (2006.01)
*H01L 29/786* (2006.01)
*H01L 29/49* (2006.01)
*H01L 29/45* (2006.01)

(52) U.S. Cl.
CPC ............ *G09G 2300/0819* (2013.01); *G09G 2300/0842* (2013.01); *G09G 2300/0866* (2013.01)

(56) References Cited

U.S. PATENT DOCUMENTS

| | | |
|---|---|---|
| 8,836,617 B2 | 9/2014 | Iida et al. |
| 8,976,089 B2 * | 3/2015 | Iida et al. ............ 345/77 |
| 2003/0168992 A1 | 9/2003 | Noguchi et al. |
| 2004/0256620 A1 | 12/2004 | Yamazaki et al. |
| 2006/0279478 A1 | 12/2006 | Ikegami |
| 2007/0120188 A1 | 5/2007 | Kubota et al. |
| 2009/0073155 A1 | 3/2009 | Akimoto et al. |
| 2009/0195530 A1 | 8/2009 | Ozaki |
| 2009/0256827 A1 | 10/2009 | Tanikame |

FOREIGN PATENT DOCUMENTS

| | | |
|---|---|---|
| JP | 2003-330387 A | 11/2003 |
| JP | 2004-119219 A | 4/2004 |
| JP | 2006-148040 A | 6/2006 |
| JP | 2006-276143 A | 10/2006 |

\* cited by examiner

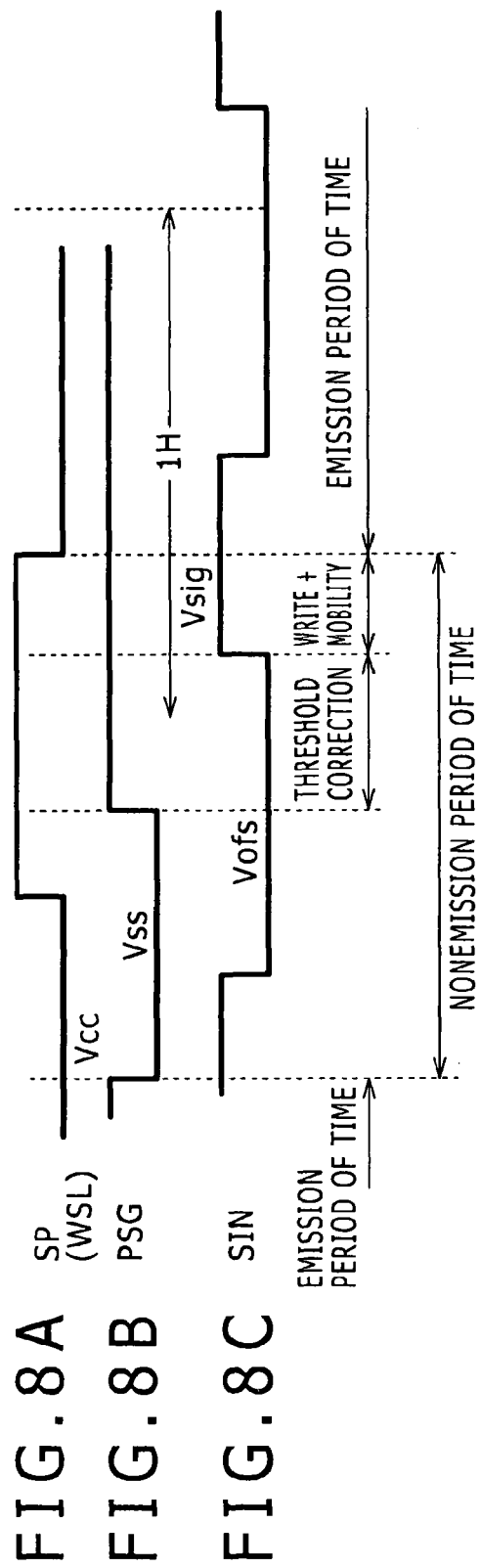

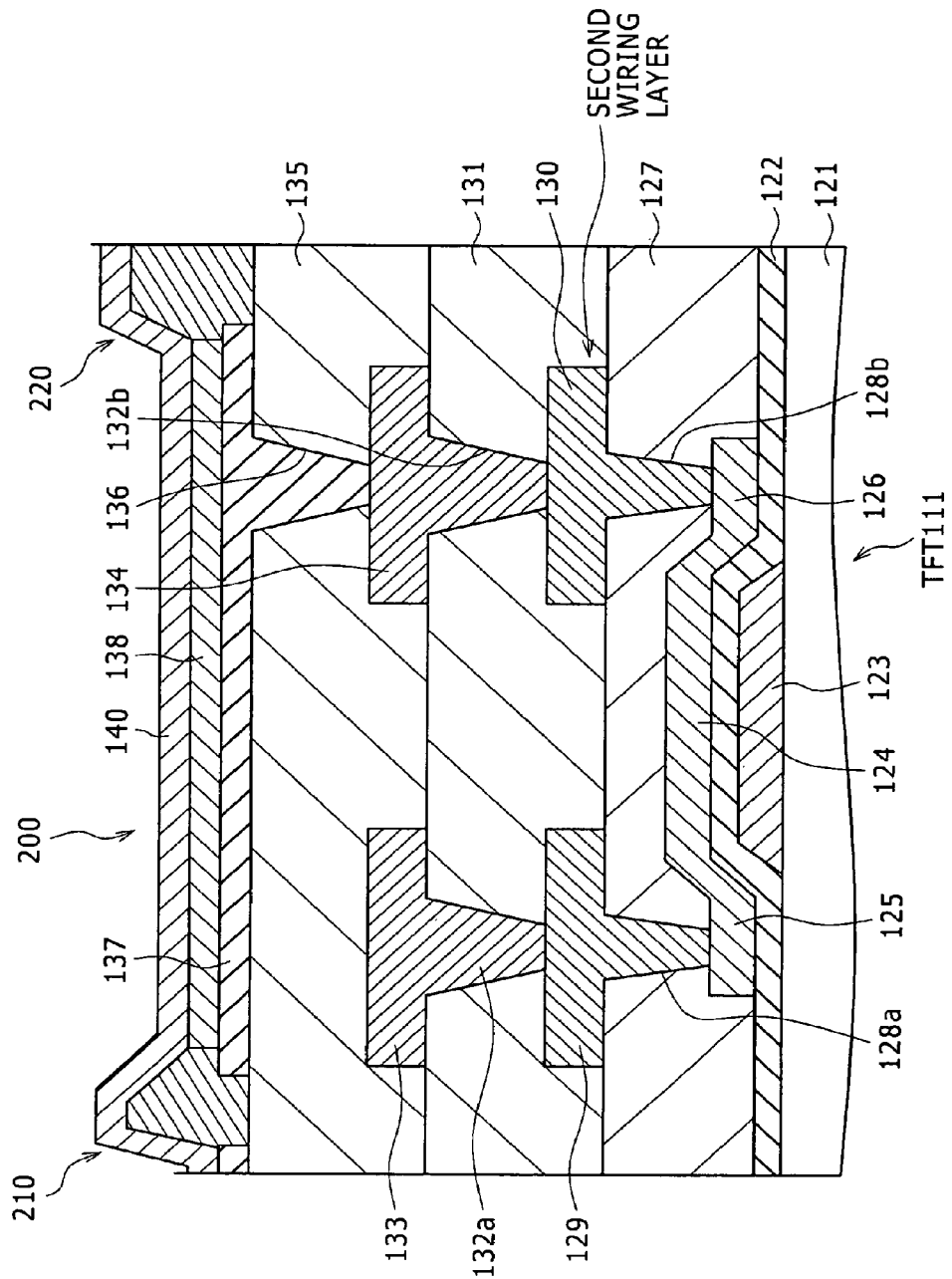

FORMATION OF GATE ELECTRODE (FIRST WIRING)

FORMATION OF GATE INSULATING FILM (SiO$_2$) DEPOSITION AND POLYCRYSTALLIZATION OF AMORPHOUS Si FORMATION OF SOURCE AND DRAIN

DEPOSITION OF INSULATING FILM (SiO$_2$)

FORMATION OF CONTACT HOLES

FORMATION OF SOURCE ELECTRODE AND DRAIN ELECTRODE (SECOND WIRING)

FORMATION OF INTERLAYER FILM

FORMATION OF CONTACT HOLES

FORMATION OF LOW-RESISTANCE ELECTRODES (THIRD WIRING)

FORMATION OF FLATTENING FILM

FORMATION OF ANODE ELECTRODE

FORMATION OF GATE ELECTRODE (FIRST WIRING)

FORMATION OF GATE INSULATING FILM (SiO$_2$) DEPOSITION AND POLYCRYSTALLIZATION OF AMORPHOUS Si FORMATION OF SOURCE AND DRAIN

DEPOSITION OF INSULATING FILM (SiO$_2$)

FORMATION OF CONTACT HOLES

FORMATION OF SOURCE ELECTRODE AND DRAIN ELECTRODE (SECOND WIRING)

FORMATION OF INTERLAYER FILM

FORMATION OF LOW-RESISTANCE ELECTRODES (THIRD WIRING)

FORMATION OF FLATTENING FILM

FORMATION OF ANODE ELECTRODE

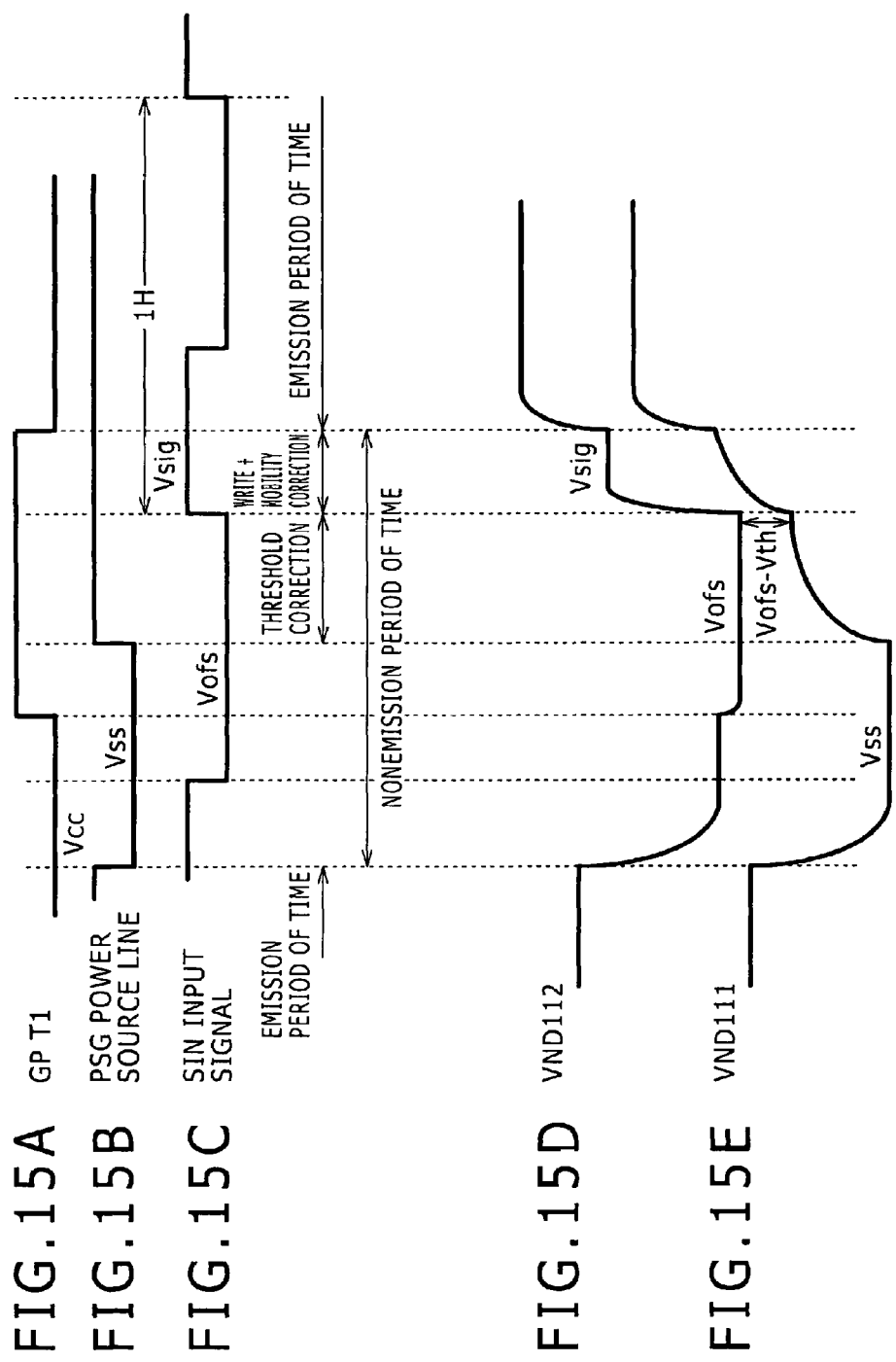

PIXEL CIRCUIT AND DISPLAY DEVICE, AND A METHOD OF MANUFACTURING PIXEL CIRCUIT

CROSS REFERENCES TO RELATED APPLICATIONS

This is a Continuation Application of U.S. patent application Ser. No. 14/447,670 filed Jul. 31, 2014, which is a Continuation Application of U.S. patent application Ser. No. 13/426,865 filed Mar. 22, 2012, now U.S. Pat. No. 8,836,617, which is a Continuation Application of U.S. patent application Ser. No. 11/979,308 filed Nov. 1, 2007, now U.S. Pat. No. 8,188,941, issued on May 29, 2012, which in turn claims priority from Japanese Application No.: 2006-311495, filed on Nov. 17, 2006, the entire contents of which are incorporated herein by reference. This Application is related to U.S. patent application Ser. No. 13/666,158 filed Nov. 1, 2012, now U.S. Pat. No. 8,760,372, issued on Jun. 24, 2014.

BACKGROUND OF THE INVENTION

1. Field of the Invention

The present invention relates to a pixel circuit including a light emitting element such as an organic electroluminescence (EL) light emitting element and an active matrix type display device, and a method of manufacturing the pixel circuit.

2. Description of the Related Art

In an image display device, for example, a liquid crystal display device or the like, a large number of pixels are arranged in matrix, and an image is displayed by controlling a light intensity every pixel in correspondence to information on an image to be displayed.

This is also applied to an organic EL display device. However, the organic EL display device is a so-called self-emission type display device having a light emitting element in each of pixel circuits. Thus, the organic EL display device has such advantages that visibility for an image is high, no backlight is required, a response speed is high, and so forth as compared with a liquid crystal display device.

In addition, the organic EL display device is largely different from the liquid crystal display device or the like in that a light emitting element is of a current control type in which a luminance of each of the light emitting elements is controlled with a value of a current caused to flow therethrough, thereby obtaining gradation of coloring.

The organic EL display device can adopt, as its driving system, a simple matrix system and an active matrix system similarly to the case of the liquid crystal display device. However, the former involves such a problem that it is difficult to realize a large and high-definition display device, and so forth although a simple structure can be adopted. In order to solve this problem, an active matrix system is actively developed in which a current caused to flow through a light emitting element provided inside each of pixel circuits is controlled by an active element provided inside each of the pixel circuits, generally, a thin film transistor (TFT).

FIG. 1 is a block diagram showing a structure of a general organic EL display device.

This organic EL display device, as shown in FIG. 1, includes a pixel array portion 2, a horizontal selector (HSEL) 3, a write scanner (WSCN) 4, signal lines (data lines) SGL1 to SGLn, and scanning lines WSL1 to WSLm. Here, in the pixel array portion 2, pixel circuits (PXLC) 2a are disposed in matrix of m×n. The signal lines SGL1 to SGLn are successively selected by the horizontal selector 3, and a data signal corresponding to luminance information is successively supplied to the signal lines SGL1 to SGLn. Also, the scanning lines WSL1 to WSLm are successively selected and driven by the write scanner 4.

It is noted that the horizontal selector 3 and the write scanner 4 may be formed on polycrystalline silicon, or may be formed in the form of MOSICs or the like in the periphery of the pixels.

FIG. 2 is a circuit diagram showing a structural example of the pixel circuit 2a shown in FIG. 1. This circuit diagram, for example, is shown in U.S. Pat. No. 5,684,365 (Patent Document 1), and Japanese Patent Laid-Open No. Hei 8-234683 (Patent Document 2).

The pixel circuit shown in FIG. 2 has the simplest circuit structure among those of a large number of pixel circuits proposed, and is a circuit utilizing a 2 transistor driving system.

The pixel circuit 2a of FIG. 2 includes a p-channel thin film field effect transistor (hereinafter referred to as "a TFT") 11 and a TFT 12, a capacitor C11, and an organic EL light emitting element (OLED) 13 as a light emitting element. In addition, in FIG. 2, reference symbol SGL designates a signal line, and reference symbol WSL designates a scanning line.

The organic EL light emitting element may be called an organic light emitting diode (OLED) in many cases because it has a rectifying property. For this reason, the light emitting element adopts a symbol of a diode in FIG. 2 and others. However, in the following description, the rectifying property is not necessarily required for the organic light emitting diode.

Referring to FIG. 2, a source of the TFT 11 is connected to a power source potential Vcc, and a cathode of the organic EL light emitting element 13 is connected to a ground potential GND. An operation of the pixel circuit 2a shown in FIG. 2 is as follows.

Step ST1:

When the scanning line WSL is held in a selection state (at a low level in this case), and a write potential Vdata is applied to the signal line SGL, the TFT 12 is turned ON to charge up or discharge the capacitor C11. As a result, a gate potential of the TFT 11 becomes the write potential Vdata.

Step ST2:

When the scanning line WSL is held in a nonselection state (at a high level in this case), the signal line SGL and the TFT 11 are electrically disconnected to each other. However, the gate potential of the TFT 11 is stably held by the capacitor C11.

Step ST3:

A current caused to flow through the TFT 11 and the organic EL light emitting element 13 comes to have a value corresponding to a gate to source voltage of the TFT 11. Thus, the organic EL light emitting element 13 continues to emit a light with the luminance corresponding to this current value.

An operation for selecting the scanning line WSL, thereby transmitting the luminance information given to the data line to the inside of the pixel as in Step ST1 described above will be referred hereinafter as "write".

As described above, in the pixel circuit 2a shown in FIG. 2, when once the write potential Vdata is written thereto, the organic EL light emitting element 13 continues to emit a light with given luminance until the next rewrite is carried out.

As described above, in the pixel circuit 2a, the value of the current caused to flow through the organic EL light emitting element 13 is controlled by changing the voltage applied to a gate of the TFT 11 as the drive transistor.

At this time, a source of the p-channel drive transistor is connected to the power source potential Vcc, and thus the TFT 11 usually operates in a saturation region. Therefore, the TFT 11 operates as a constant current source having a current value shown in the following expression (1):

$$Ids = \frac{1}{2}\mu(W/L)Cox(Vgs-|Vth|)^2$$

Where μ represents a mobility of a carrier, Cox represents a gate capacity per unit area, W represents a gate width, L represents a gate length, Vgs represent a gate to source voltage of the TFT 11, and Vth represents a threshold of the TFT 11.

In the simple matrix type image display device, each of the light emitting elements emits a light only for a selected moment. On the other hand, in the active matrix type image display device, as described above, each of the light emitting elements continues to emit a light even after completion of the write operation. From this reason, the active matrix type image display device is more advantageous, especially, in the large and high-definition display device than the simple matrix type image display device in that a peak luminance and a peak current of the light emitting element are reduced, and so forth.

FIG. 3 is a graphical representation showing deterioration with time of current-voltage (I-V) characteristics of the organic EL light emitting element. Referring to FIG. 3, a curve indicated by a solid line represents the I-V characteristics in a phase of an initial state, and a curve indicated by a broken line represents the I-V characteristics after the deterioration with time.

In general, as shown in FIG. 3, the I-V characteristics of the organic EL light emitting element deteriorate as time elapses.

However, as described above, the constant current continues to be caused to flow through the organic EL light emitting element because the 2 transistor driving system shown in FIG. 2 is the constant current driving system. As a result, even when the I-V characteristics of the organic EL light emitting element deteriorate, an emission luminance of the organic EL light emitting element is free from the deterioration with time.

Now, the pixel circuit 2a of FIG. 2 is constituted by the p-channel TFT. However, if the pixel circuit 2a of FIG. 2 can be constituted by an n-channel TFT, the existing amorphous silicon (s-Si) process can be used in manufacturing a TFT. This leads to that the low-cost promotion for a TFT substrate becomes possible.

Next, a description will now be given with respect to the basic pixel circuit in which the p-channel TFTs are replaced with the n-channel TFT, respectively.

FIG. 4 is a circuit diagram showing a pixel circuit in which the p-channel TFTs in the pixel circuit of FIG. 2 are replaced with the n-channel TFT, respectively.

A pixel circuit 2b of FIG. 4 includes n-channel TFTs 21 and 22, a capacitor C21, and an organic EL light emitting element (OLED) 23 as the light emitting element. In addition, in FIG. 4, reference symbol SGL designates a data line, and reference symbol WSL designates a scanning line.

In this pixel circuit 2b, a drain side of the re-channel TFT 21 as a drive transistor is connected to a power source potential Vcc, and a source thereof is connected to an anode of the organic EL light emitting element 23, thereby forming a source follower circuit.

FIG. 5 is a graphical representation showing an operating point between the n-channel TFT 21 as the drive transistor, and the organic EL light emitting element 23 in an initial state. In FIG. 5, an axis of abscissa represents a drain to source voltage Vds of the n-channel TFT 21, and an axis of ordinate represents a drain to source current $I_{ds}$ of the n-channel TFT 21.

As shown in FIG. 5, a source voltage depends on the operating point between the n-channel TFT 21 as the drive transistor and the organic EL light emitting element 23. Thus, the source voltage takes values different from one another depending on a gate voltage.

Since the n-channel TFT 21 is driven in a saturation region, it causes the current $I_{ds}$ having a current value expressed by the equation form shown in the above expression (1) with respect to the gate to source voltage Vgs corresponding to the source voltage at the operating point.

SUMMARY OF THE INVENTION

The pixel circuit 2b described above is the simplest circuit including the n-channel TFT 21 as the drive transistor, the n-channel TFT 22 as the switching transistor, and the organic EL light emitting element 23. In this case, however, the structure in which for a power signal to be applied to the power source line, two signals are switched over each other and also for a video signal to be supplied to the signal line, two signals are switched over to each other is adopted in some cases.

Or, the structure in which n-channel TFTs for the mobility and cancellation of the threshold, and the like are provided in addition to the drive transistor connected in series to the organic EL light emitting diode, and the switching transistor is adopted in some cases.

A vertical scanner such as a write scanner disposed either on both side or on one side of an active matrix type organic EL display panel generates a gate pulse for the TFT as the switching transistor, or the TFTs for the threshold and the mobility which are specially provided. This pulse signal is supplied to a gate of desired one of the TFTs in the pixel circuits disposed in matrix through a wiring.

When two or more TFTs exist each of which receives the pulse signal applied thereto, timings at which the pulse signals are applied to the two or more TFTs, respectively, become important.

However, the delay of the pulse signal, the change in transient, and the voltage drop in the power source line are caused by an influence of a wiring resistance and a wiring capacity of the drive wiring and the power source line connected to the pixel circuit. Thus, the shading, the streak or the unevenness occurs. As a result, the shading, the streak or the unevenness occurs in the form of nonuniformity or visual surface roughness in an image in some cases.

In addition, the light emitting region of the light emitting element is formed so as to have a stepped portion. However, when the step of the stepped portion is large, the outside light reflected by the surface of the display portion becomes more, which results in that it is impossible to obtain the high-definition image quality.

The influence of these problems becomes large as the large size promotion, and the high definition promotion of the panel further advance.

In the light of the foregoing, it is therefore desirable to provide a pixel circuit and a display device each of which is capable of relaxing a stepped portion in a light emitting region, and obtaining a high quality image, and a method of manufacturing the pixel circuit.

According to an embodiment of the present invention, there is provided a pixel circuit, including: a signal line; a drive transistor; a light emitting element; and at least one power source line wired so as to intersect perpendicularly the signal line; in which the drive transistor is connected between the wiring layer and a predetermined electrode of the light emitting element; and any one of wirings intersecting perpendicularly one another is wired in a region that overlaps a light emitting region of the light emitting element in a lamination direction of layers, and the intersecting area is located outside of the light emitting region.

According to another embodiment of the present invention, there is provided a display device, including: a pixel array portion having a plurality of pixel circuits formed therein, the pixel circuit having a light emitting element, a power source line, a drive transistor connected between the power source line and a predetermined electrode of the light emitting element, and a switching transistor connected between a signal line and a gate electrode of the drive transistor; a first scanner for supplying a potential to the power source line; and a second scanner for outputting a drive signal to the switching transistor; in which the power source line is wired so as to intersect perpendicularly the signal line; any one of wirings intersecting perpendicularly one another is wired in a region that overlaps a light emitting region of the light emitting element in a lamination direction of layers, and the intersecting area is located outside of the light emitting region.

According to the embodiments of the present invention, the wiring layers, such as the signal lines, intersecting perpendicularly one another is formed so as not to overlap the light emitting element in the direction of lamination of the layers of the light emitting region. As a result, the stepped portion is relaxed.

Also, according to the embodiments of the present invention, the stepped portion can be relaxed, and thus the high-quality image can be obtained.

BRIEF DESCRIPTION OF THE DRAWINGS

FIGS. 8A to 8C are respectively timing charts explaining a basic operation of the pixel circuit shown in FIG. 7;

FIG. 10 is a cross sectional view explaining an example of a measure for improving relaxation of a stepped portion, an image quality, and the like;

FIGS. 15A to 15E are respectively timing charts explaining a concrete operation of the pixel circuit shown in FIG. 7;

DETAILED DESCRIPTION OF THE PREFERRED EMBODIMENT

Hereinafter, an embodiment of the present invention will be described with reference to the accompanying drawings.

Figure 1:
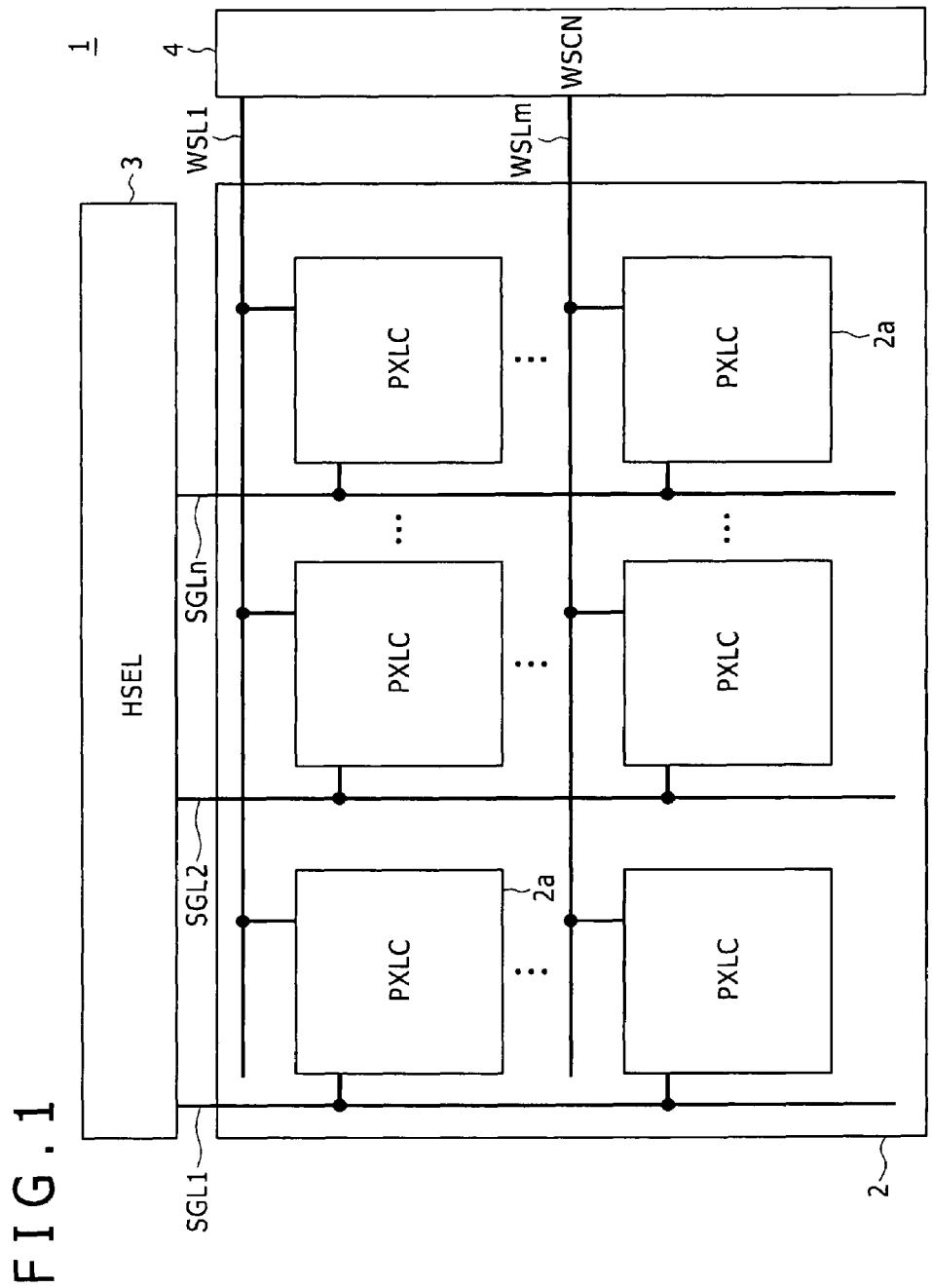
FIG. 1 is a block diagram showing a structure of a general organic EL display device.
Figure 2:
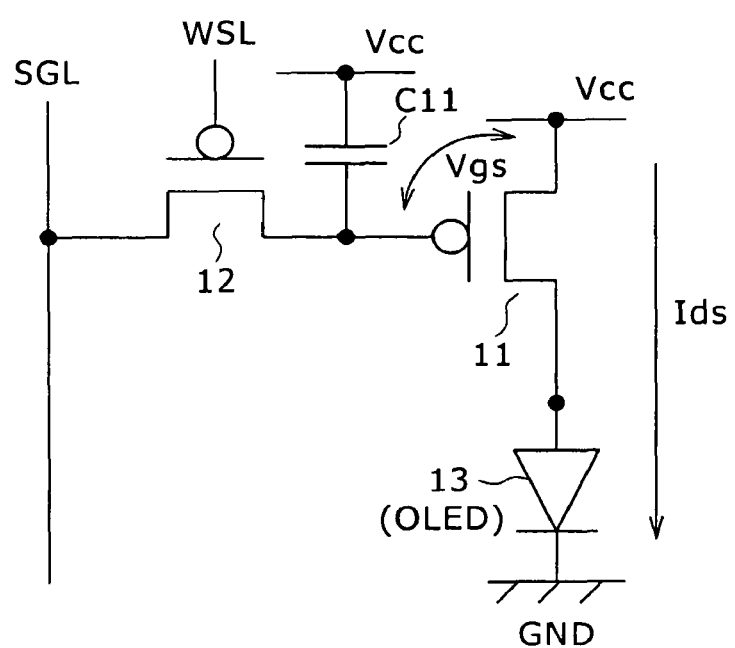
FIG. 2 is a circuit diagram showing a structural example of a pixel circuit shown in FIG. 1.
Figure 3:
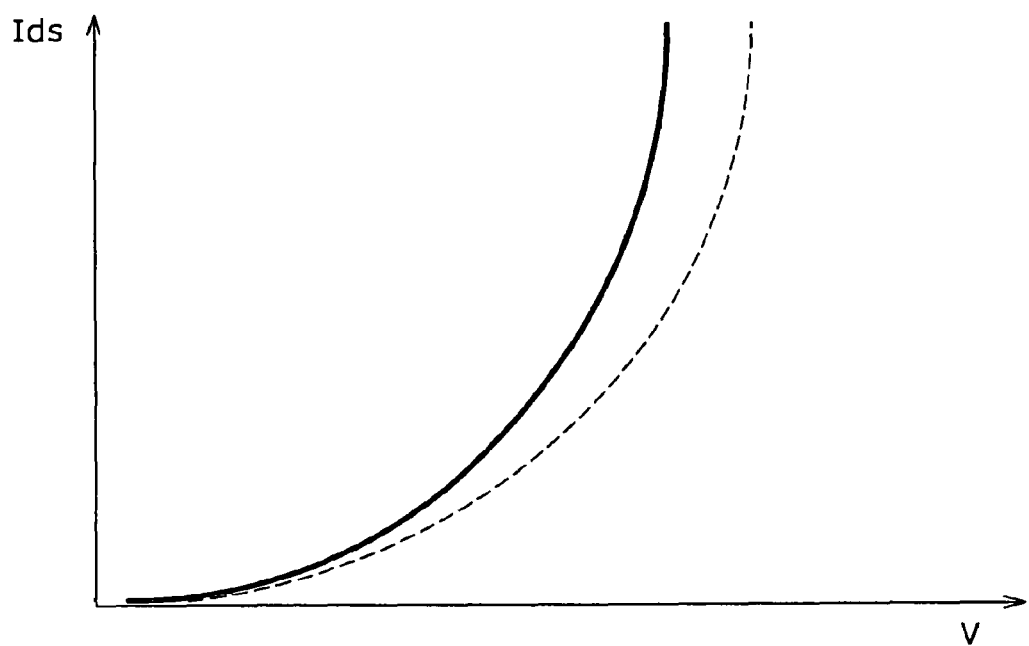
FIG. 3 is a graphical representation showing deterioration with time of current-voltage (I-V) characteristics of an organic EL light emitting element.
Figure 4:
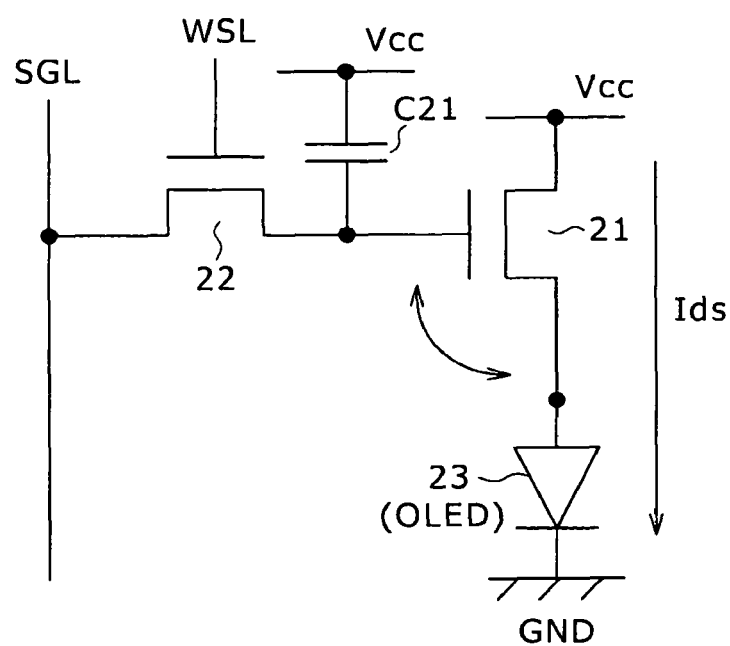
FIG. 4 is a circuit diagram showing a pixel circuit in which p-channel TFTs of the pixel circuit shown in FIG. 2 are replaced with n-channel TFTs, respectively.
Figure 5:
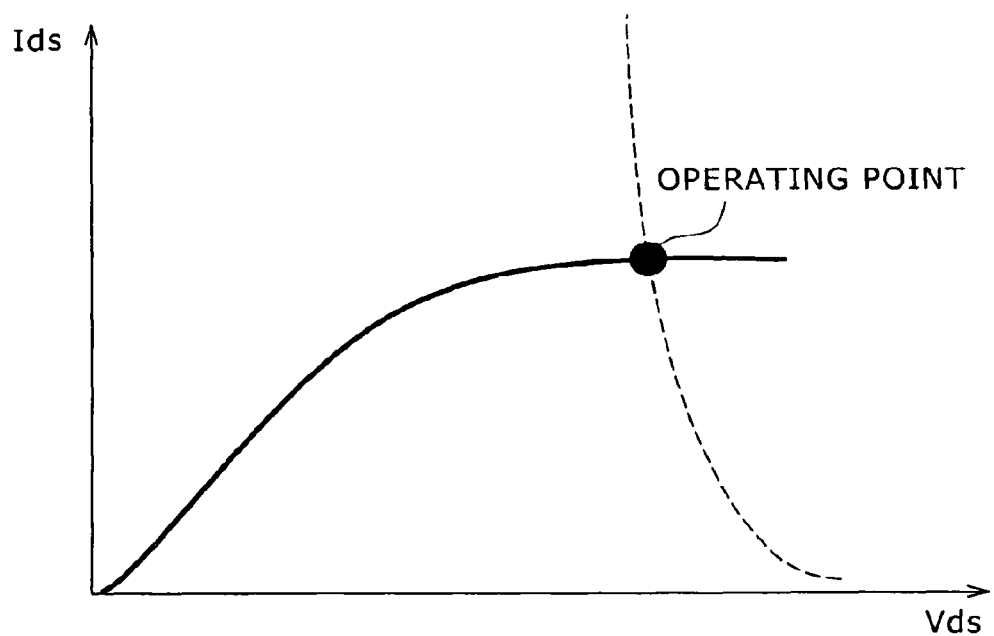
FIG. 5 is a graphical representation showing an operating point between a TFT as a drive transistor, and an organic EL light emitting element in an initial state.
Figure 6:
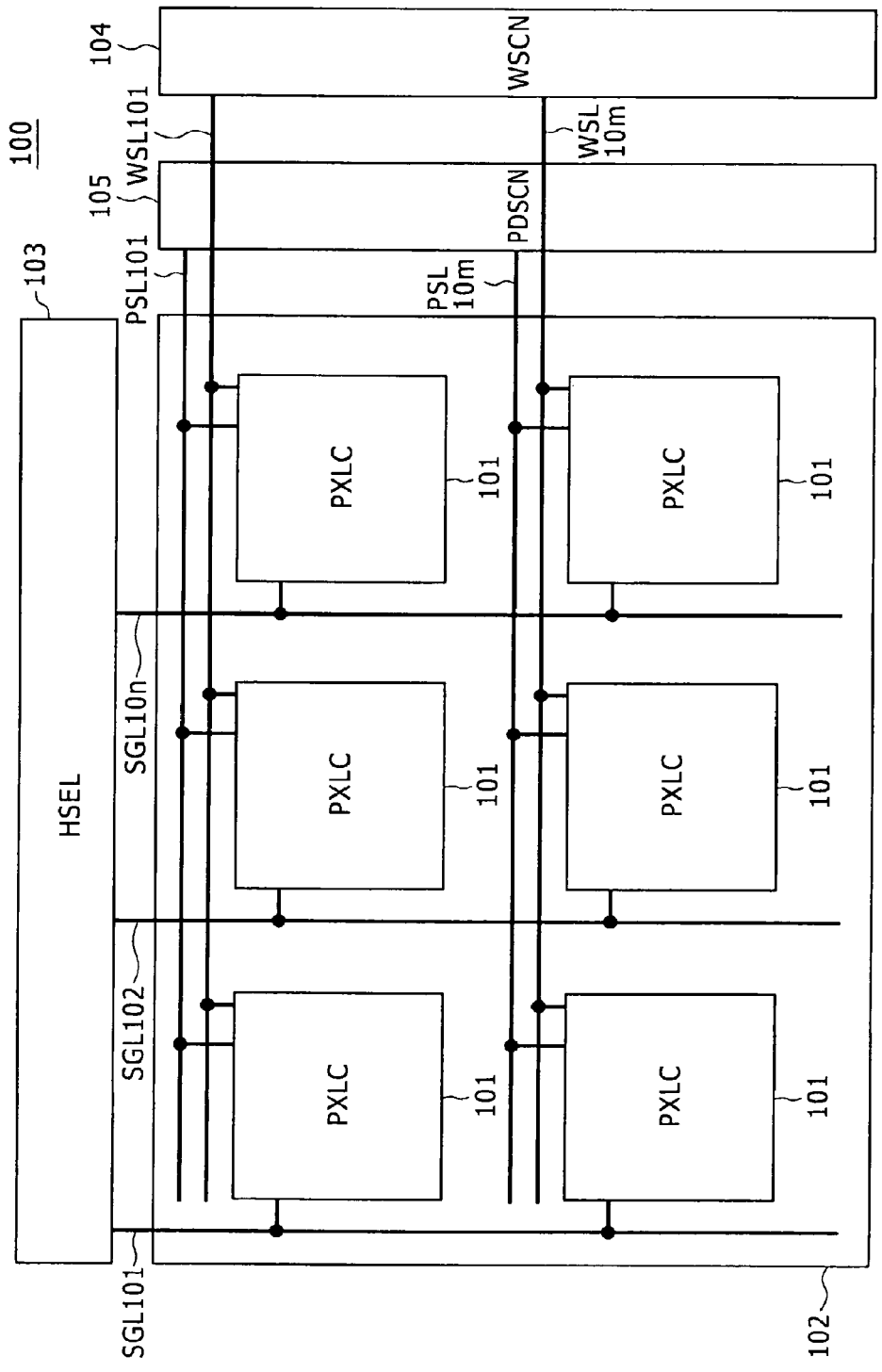
FIG. 6 is a block diagram showing a structure of an organic EL display device adopting a pixel circuit according to an embodiment of the present invention.

FIG. 6 is a block diagram showing a structure of an organic EL display device adopting a pixel circuit according to an embodiment of the present invention.

Figure 7:
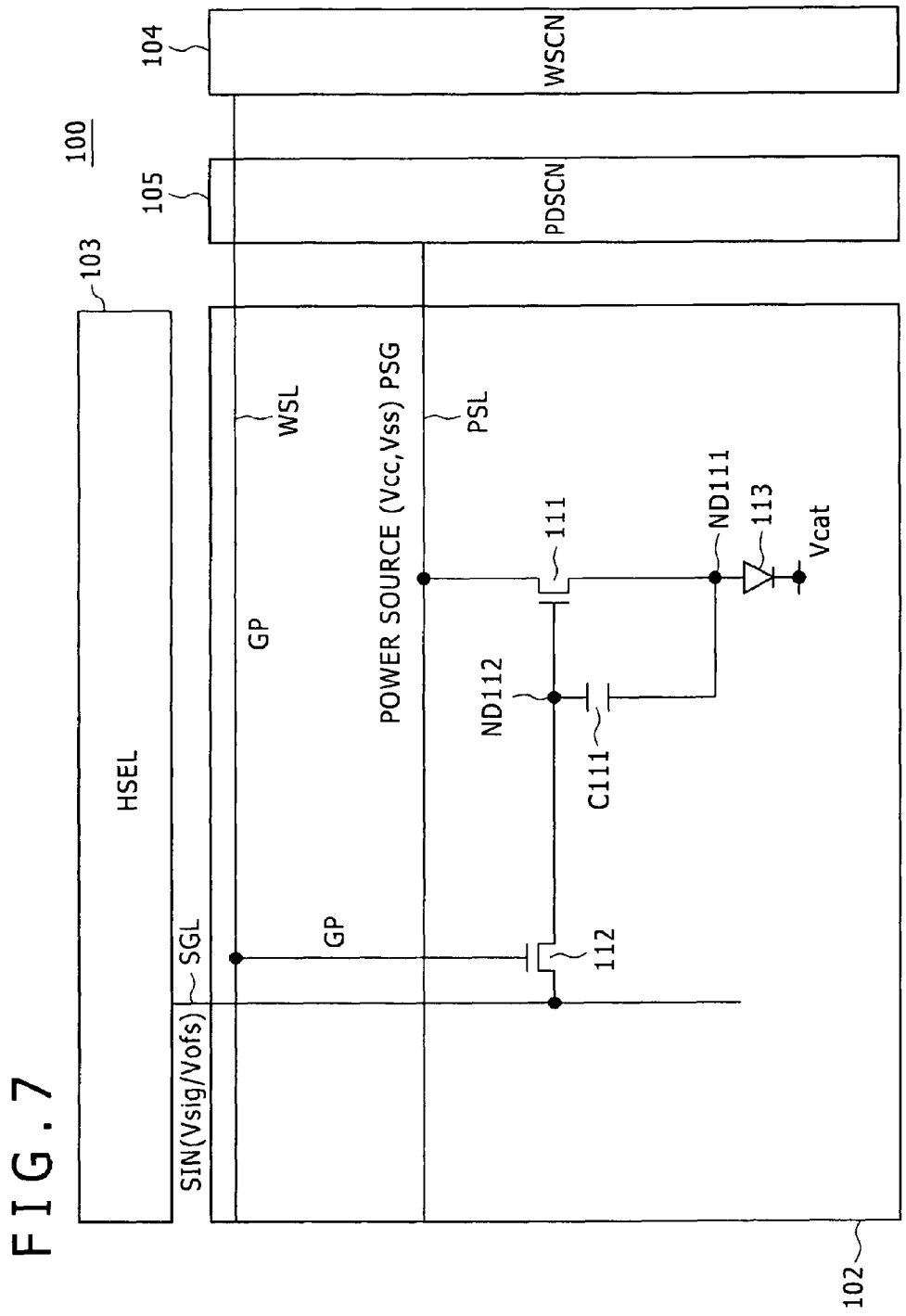
FIG. 7 is a circuit diagram showing a concrete structure of the pixel circuit according to the embodiment of the present invention.

FIG. 7 is a circuit diagram showing a concrete structure of the pixel circuit according to the embodiment of the present invention.

A display device 100, as shown in FIGS. 6 and 7, includes a pixel array portion 102, a horizontal selector (HSEL) 103, a write scanner (WSCN) 104 as a second scanner, a power drive scanner (PDSCN) 105 as a first scanner, signal lines SGL101 to SGL10n, scanning lines WSL101 to WSL10m, and power drive lines PSL101 to PSL10m. Here, a plurality of pixel circuits 101 are disposed in matrix of m×n in the pixel array portion 102. The signal lines SGL101 to SGL10n are successively selected by the horizontal selector 103, and a data signal Vsig corresponding to luminance information, and an input signal SIN of an offset signal Vofs are successively supplied to the signal lines SGL101 to SGL10n. The scanning lines WSL101 to WSL10m serve as drive wirings which are selectively driven by a gate pulse (scanning pulse) GP from the write scanner 104. Also, the power drive lines PSL101 to PSL10m serve as drive wirings which are driven by applying thereto a power signal PSG. Here, the power signal PSG is selectively set either at Vcc (for example, a power source voltage) or at Vss (for example, a negative side voltage) by the power drive scanner 105.

It is noted that although the pixel circuits 101 are disposed in matrix of m×n in the pixel array portion 102, in FIG. 6, an example in which the pixel circuits 101 are disposed in matrix of 2(=m)×3(=n) is shown for the sake of simplification of the drawing.

In addition, in FIG. 7 as well, the concrete structure of one pixel circuit is shown for the sake of simplification of the drawing.

The pixel circuit 101 according to this embodiment of the present invention, as shown in FIG. 7, includes an n-channel TFT 111 as a drive transistor, an n-channel TFT 112 as a switching transistor, a capacitor C111, an interpolation capacitor C112, a light emitting element 113 constituted by an organic EL light emitting element (OLED: electro-optic element), a first node ND111, and a second node ND112.

In the pixel circuit 101, the n-channel TFT 111 as the drive transistor, the first node ND111, and the organic EL light emitting element (OLED) 113 are connected in series between the power drive line (power source line) PSL (101 to 10m), and a predetermined reference potential Vcat (for example, the ground potential).

More specifically, a cathode of the organic EL light emitting element 113 is connected to the reference potential Vcat, and an anode thereof is connected to the first node ND111. Also, a source (for example, a second electrode) of the n-channel TFT 111 is connected to the first node ND111, and a drain (for example, a first electrode) thereof is connected to the power drive line PSL.

Also, a gate of the n-channel TFT 111 is connected to the second node ND112.

In addition, a first electrode of the capacitor C111 is connected to the first node ND111, and a second electrode thereof is connected to the second node ND112.

A source and a drain of the n-channel TFT 112 are connected to the signal line SGL and the second node ND112, respectively. Also, a gate of the n-channel TFT 112 is connected to the scanning line WSL.

In such manner, in the pixel circuit 101 of this embodiment, the capacitor C111 as the pixel capacity is connected between the gate and the source of the re-channel TFT 111 as the drive transistor.

FIGS. 8A to 8C are respectively timing charts explaining a basic operation of the pixel circuit shown in FIG. 7.

FIG. 8A shows a gate pulse (scanning pulse) SP which is applied to the scanning line WSL. FIG. 8B shows a power signal PSG which is applied to the power drive line PSL. Also, FIG. 8C shows an input signal SIN which is applied to the signal line SGL.

In order to cause the organic EL light emitting element 113 of the pixel circuit 101 to emit a light, as shown in FIGS. 8A to 8C, for an emission period of time, the power signal Vss (for example, a negative voltage) is applied to the power drive line PSL. The offset signal Vofs is propagated through the signal line SGL to be inputted to the second node ND112 through the n-channel TFT 112. After that time, the power signal Vcc (corresponding to the power source voltage) is applied to the power drive line PSL, thereby correcting a threshold of the n-channel TFT 111.

Thereafter, the data signal Vsig corresponding to luminance information is applied to the signal line SGL, thereby writing a signal to the second node ND112 through the n-channel TFT 112. At this time, the mobility is simultaneously and in parallel corrected because the signal is written to the second node ND112 through the re-channel TFT 112 while a current is caused to flow through the n-channel TFT 111.

As a result, the n-channel TFT 112 is held in a nonconduction state, and thus the organic EL light emitting element 113 is caused to emit a light in correspondence to the luminance information.

In this embodiment, the wiring layers, such as the signal lines SGL, intersecting perpendicularly one another are wired so as not to overlap the organic EL light emitting element 113 in a direction of lamination of layers of the light emitting region. As a result, the stepped portion of the opening portion can be relaxed, and thus the outside light reflected by the surface of the display portion can be reduced. This embodiment is constituted in such a manner.

Figure 9A:
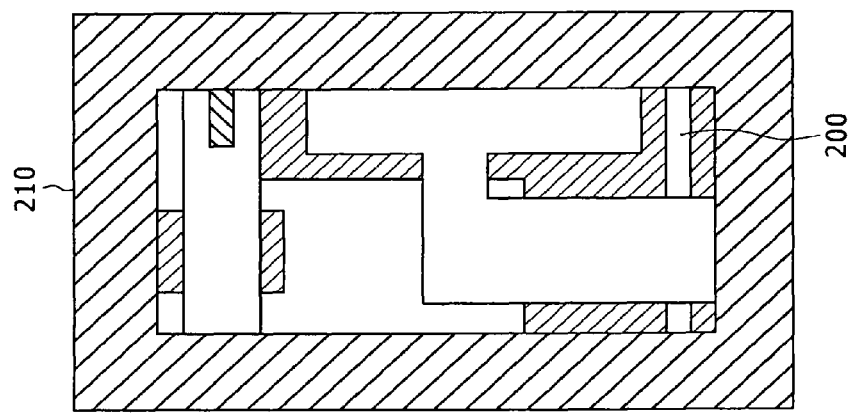
FIGS. 9A and 9B are respectively views explaining a structure in which no signal line is wired in a light emitting region (opening area) of a light emitting element, and thus is wired in a non-light emitting region (nonopening area) of a light emitting element.
Figure 9B:
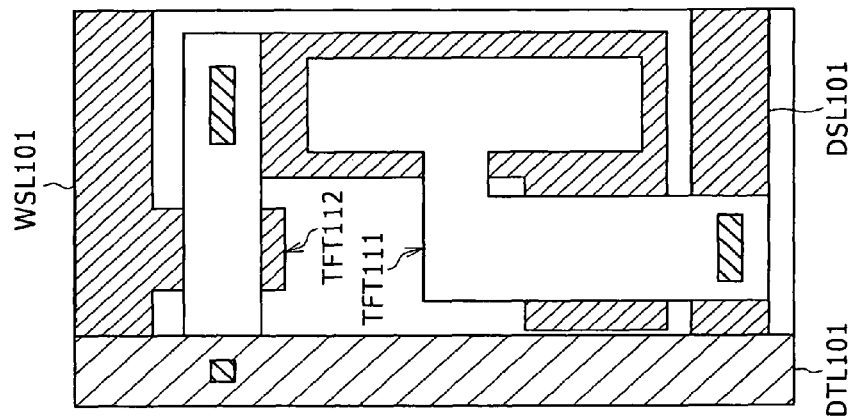

That is to say, as shown in FIG. 9A, the power drive line PSL and the scanning line WSL are formed so as to intersect perpendicularly the signal line SGL. In this embodiment, however, as shown in FIG. 9B, the signal line SGL is not disposed in the light emitting region (opening area) of the light emitting element 113, and thus is absent in the non-light emitting region (nonopening area) 210.

A top emission system is given as a technique for forming a large light emitting region.

This embodiment adopts this top emission system, and none of the wiring layers intersecting perpendicularly one another is disposed in the lower layers each lying below the light emitting region, thereby relaxing the stepped portion.

Also, in the display device 100 of this embodiment, the following measures are taken for the purpose of improving that the unevenness such as the shading occurs along with the voltage drop or the like from the power source line to the pixel circuit 101 so as to occur in the form of the nonuniformity or the visual surface roughness in the image, that is, improving the image quality or the like.

FIG. 10 is a cross sectional view explaining an example of a measure for relaxing the stepped portion, and improving the image quality or the like.

In this example of the measure, the power source line PSL as the line for the power source to which the drain as the first electrode of the n-channel TFT 111 as the drive transistor of each of the pixel circuit 101 is connected is made of a low-resistance metal such as aluminum (Al), and is formed in the form of a multilayer interconnection.

In parallel thereto, the wiring layer to which the source as the second electrode of the n-channel TFT 111 is connected is also made of the same material as that of the power source line PSL at the same level as that of the power source line PSL, and is formed in the form of a multilayer interconnection. Also, the multilayered source electrode of the n-channel TFT 111 is connected to the anode electrode of the organic EL light emitting element 113.

It is noted that each of the n-channel TFTs 111 and 112 of each of the pixel circuits 101 of this embodiment is of a bottom gate type, and the gate electrode (control terminal) thereof is formed as a first wiring layer on the lower layer side in the lamination direction of the layers.

In general, the gate electrode of the TFT is a high-resistance wiring, and is formed by depositing a metal such as molybdenum (Mo) or tantalum (Ta), or an alloy by utilizing a sputtering method or the like.

A concrete structure will now be described as follows.

For example, in the n-channel TFT 111 having the bottom gate structure, as shown in FIG. 10, a gate electrode 123, as a first wiring layer, covered with a gate insulating film 122 is formed on a transparent insulating substrate (for example, a glass substrate) 121. Also, the gate electrode 123 is connected to the second node ND112.

As has been described above, the gate electrode is formed by depositing a metal such as molybdenum (Mo) or tantalum (Ta), or an alloy by utilizing the sputtering method or the like.

In the n-channel TFT 111, a semiconductor film (channel formation region) 124, and a pair of n$^+$-type diffusion layers 125 and 126 are formed on the gate insulating film 122. In this case, the pair of n$^+$-type diffusion layers 125 and 126 is formed so as to sandwich the semiconductor film 124 between them.

Also, an insulating film 127 made of an oxide film or the like, for example, formed from $SiO_2$ is formed on the transparent insulating substrate 121 so as to cover the gate insulating film 122, the channel formation region 124, and the pair of n$^+$-type diffusion layers 125 and 126.

It is noted that while not illustrated, an n$^-$-type diffusion layer (LDD) is formed between the channel formation region 124, and each of the n$^+$-type diffusion layers 125 and 126. The n$^+$-type diffusion layer forms a drain diffusion layer (corresponding to the first electrode) of the n-channel TFT 111, and the n$^+$-type diffusion layer 126 paired therewith forms a source diffusion layer (corresponding to the second electrode) of the n-channel TFT 111.

A drain electrode 129 as a second wiring layer for the first electrode is connected to one n$^+$-type diffusion layer 125 through a contact hole 128a formed in the insulating film 127. Also, a source electrode 130 as the second wiring layer for the second electrode is connected to the other n$^+$-type diffusion layer 126 through a contact hole 128b formed in the insulating film 127.

Each of the drain electrode 129 and the source electrode 130, for example, is formed by patterning an aluminum (Al) film having a low resistance.

An interlayer film 131 is formed as a flattening film so as to cover the drain electrode 129, the source electrode 130, and the insulating film 127.

The interlayer film 131, for example, is made of an oxide film, polyimide, an acrylic system resin or a photosensitive resin.

A third wiring layer (or the second wiring layer) 133 as the power source line PSL is connected to the drain electrode 129 through contact hole 132a formed in the interlayer film 131. Also, a third wiring layer 134 (or the second wiring layer) for the second electrode is connected to the source electrode 130 through a contact hole 132b formed in the interlayer film 131.

Each of the third wiring layers 133 and 134, for example, can be formed by patterning an aluminum (Al) film, or can also be made of the same material as that of an anode electrode layer 137 formed thereabove, for example, silver (Ag) or the like.

A flattening film 135 is formed so as to cover the third wiring layers 133 and 134, and the interlayer film 131.

Also, the anode electrode layer 137 of the organic EL light emitting element 113 is connected to the third wiring layer 134 for the second electrode through a contact hole 136 formed in the flattening film 135.

Moreover, an EL light emitting material layer 138 is formed on the anode electrode layer 137. An insulating film 139 is formed on both sides of the anode electrode layer 137 and the EL light emitting material layer 138, and a cathode electrode layer 140 is formed over the insulating film 139.

The wiring layers, such as the signal lines SGL, intersecting perpendicularly one another are wired so as not to overlap the organic EL light emitting element 113 in the direction of lamination of the layers of the light emitting region. Also, the flattening film 135 is formed along with forming the layers in the form of the multilayer interconnection, and the anode electrode layer 137, the light emitting element material layer 138, and the cathode electrode layer 140 are formed in this order on the flattening film 135. As a result, a stepped portion 220 of the light emitting region 200 can be relaxed, and thus the outside light reflected by the surface of the display portion can be reduced.

It is to be noted that when the flattening film is used as the interlayer film 131 formed between the second wiring layers 129, 130 and the third wiring layers 133, 134 in the above structure described above, there is feared the chamber contamination in a phase of the film deposition (sputtering) of the third wiring layers 133 and 134.

Then, an appropriation of the existing process becomes possible by making each of the third wiring layers 133 and 134 of the same material as that of the anode electrode layer 137, for example, silver (Ag).

In addition, when the power source line PSL and the source electrode are formed in the form of the multilayer interconnection to reduce the resistance, the number of manufacturing processes may increase. However, in order to reduce the number of manufacturing processes, the multilayer interconnection can also be realized by, for example, making the interlayer film 131 of the photosensitive resin.

That is to say, when the multilayer interconnection is realized by making the interlayer film 131 of the photosensitive resin, the number of processes can be reduced by making the interlayer film 131 formed between the second wiring layers 129, 130 and the third wiring layers 133, 134 of the photosensitive resin. As a result, the multilayer interconnection can be realized at a low takt and at a low cost. When the interlayer film 131 is made of an oxide film, four processes of film deposition, photolithography, etching, and resist peeling are necessary at the minimum. However, in the case of using the photosensitive resin, the interlayer film 131 can be formed only in the photolithography process.

In addition, when the wirings in the pixel circuit are formed in the form of the multilayer interconnection, and the interlayer film 131 is made of the photosensitive resin, the interlayer film is scraped in the phase of etching of the upper layer wiring, which may exert an influence on a coating property of the flattening film 135.

Thus, in this embodiment, the scraping of the interlayer film 131 exerts no influence on the coating property of the flattening film 135 by setting a thickness of each of the third wiring layers 133 and 134 as follows.

More specifically, the thickness of each of the third wiring layers 133 and 134 is set so as to fulfill the following relational expression (2):

$$tl=tp/(1+A) \qquad (2)$$

where tp is a thickness of the flattening film, tl is the thickness of the third wiring layer, and A is a constant depending on the interlayer film material.

Figure 11:
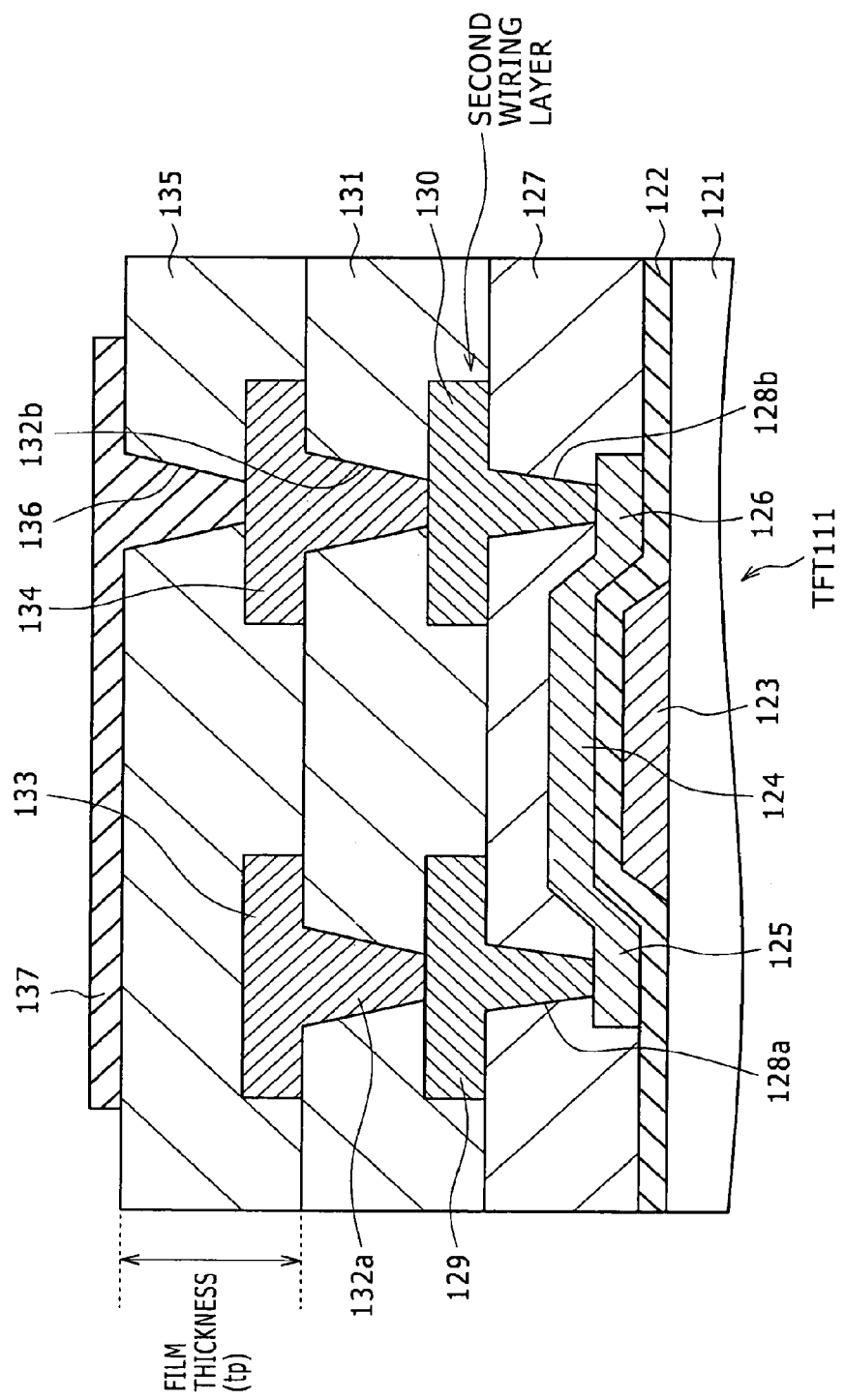
FIG. 11 is a cross sectional view showing a multilayer interconnection structure when an interlayer film is made of a photosensitive resin.

FIG. 11 is a cross sectional view showing a multilayer interconnection structure when the interlayer film is made of a photosensitive resin.

Figure 12:
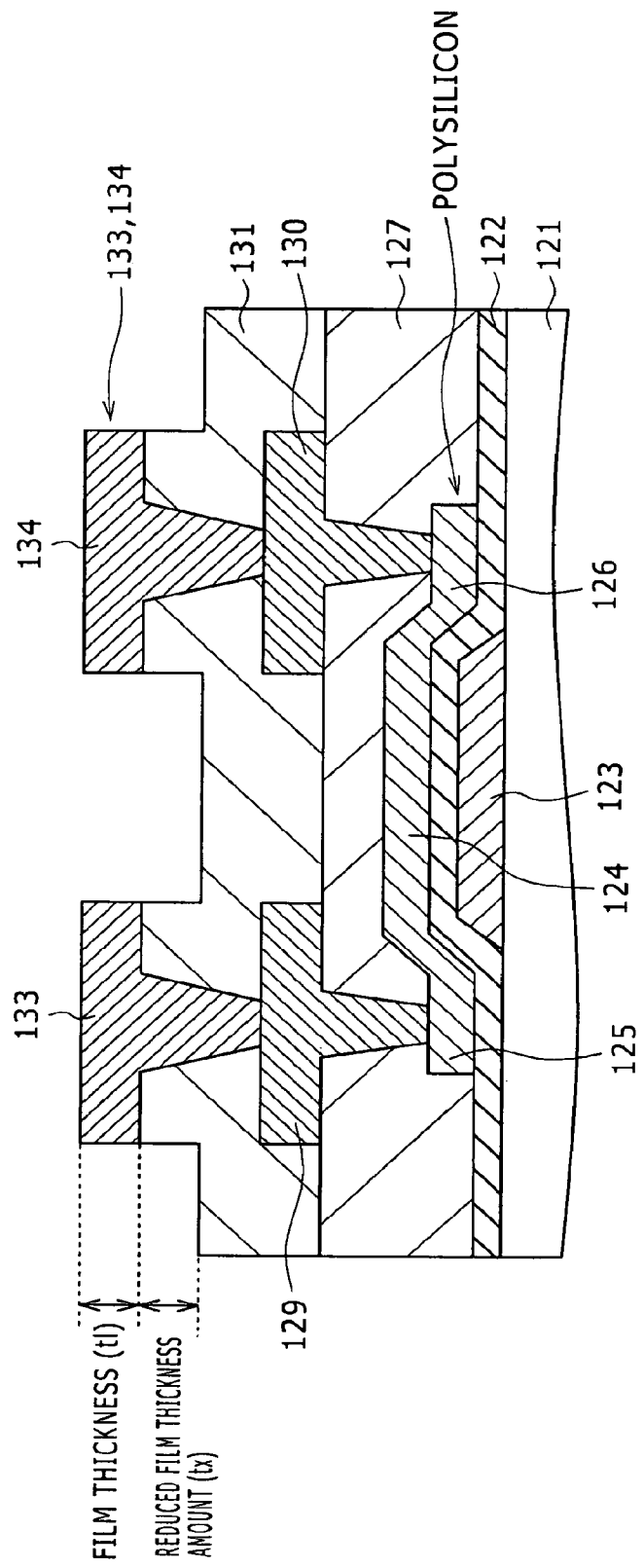
FIG. 12 is a cross sectional view showing a situation in which a thickness of the interlayer film is reduced in a phase of etching of an upper layer wiring.

FIG. 12 is a cross sectional view showing a situation in which the thickness of the interlayer film is reduced in the phase of etching of the upper layer wiring.

When the thickness of the interlayer film is reduced, a height of the actual stepped portion becomes equal to or larger than the wiring thickness during the coating of the flattening film 135, which results in the coating property of the flattening film 135 becoming worse. Or, a material for the flattening film 135 is used in large quantity, which causes a problem in terms of a cost.

All that is required is that an inequality expression of tp≧ tl+tx (where tp is the thickness of the flattening film, tl is the thickness of the wiring, and tx is an amount of film thickness reduced) is fulfilled in order to normally coat the flattening film.

In addition, since the amount of film thickness reduced is proportional to the wiring film thickness, a relational expression of tx=A×tl (where A is a constant and depends on the interlayer film material) is established. Therefore, even when the setting of tl=tp(1+A) results in that the thickness of the film is reduced, no influence is exerted on the coating property of the flattening film 131.

Next, a description will now be given with respect to a method of manufacturing the pixel circuit portion having such a structure.

In this case, the description will now be given with respect to two manufacturing method in the case where the interlayer film 131 is made of an oxide film and in the case where the interlayer film 131 is made of a photosensitive resin.

Firstly, the description will now be given with respect to the method of manufacturing the pixel circuit portion in the case where the interlayer film 131 is made of an oxide film with reference to FIGS. 13A to 13J.

Figure 13A:
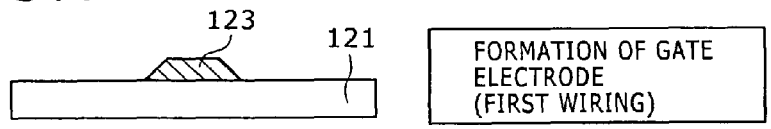
FIGS. 13A to 13J are respectively cross sectional views explaining a manufacturing method when an interlayer film is made of an oxide film.

As shown in FIG. 13A, the gate electrode 123 as the first wiring layer is formed on the transparent insulating substrate (for example, the glass substrate) 121.

As described above, the gate electrode 123 is formed by depositing a metal such as molybdenum (Mo) or tantalum (Ta), or an alloy by utilizing the sputtering method or the like.

Figure 13B:
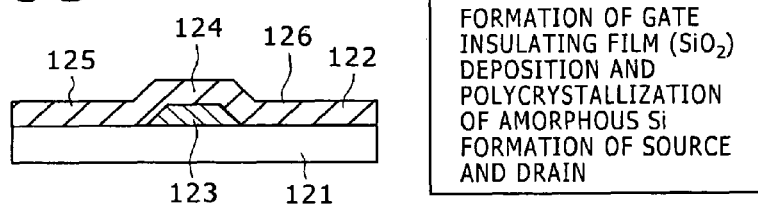

Next, as shown in FIG. 13B, after the gate insulating film 122 is made of $SiO_2$, an amorphous silicon film is deposited and polycrystallized, thereby forming the channel formation region 124, and the n$^+$-type diffusion layers 125 and 126 (the drain diffusion layer and the source diffusion layer).

Figure 13C:
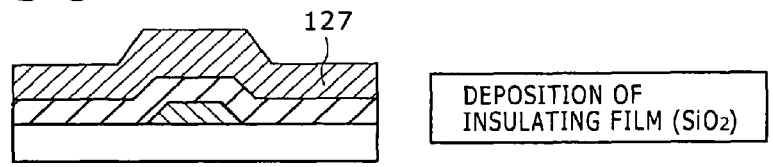

Next, as shown in FIG. 13C, the insulating film 127 is made of $SiO_2$.

Figure 13D:
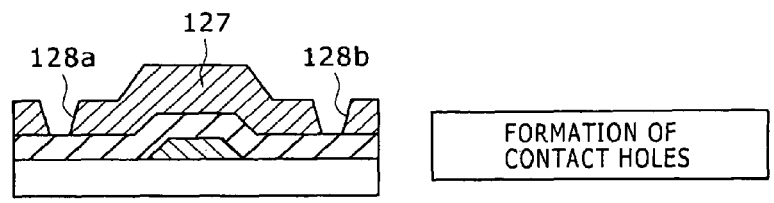

As shown in FIG. 13D, the contact holes 128a and 128b are formed in the insulating film 127 so as to extend to the drain diffusion layer 125 and the source diffusion layer 126, respectively.

Figure 13E:
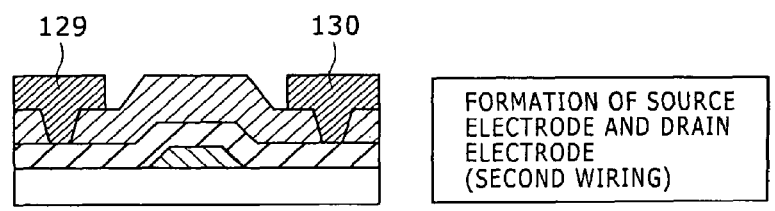

Also, as shown in FIG. 13E, the drain electrode 129 as the second wiring layer for the first electrode is formed so as to be connected to the drain diffusion layer 125 through the contact hole 128a formed in the insulating film 127. Also, the source electrode 130 as the second wiring layer for the second electrode is formed so as to be connected to the source diffusion layer 126 through the contact hole 128b formed in the insulating film 127.

Each of the drain electrode 129 and the source electrode 130, for example, is formed by patterning an aluminum (Al) film having a low resistance.

Figure 13F:
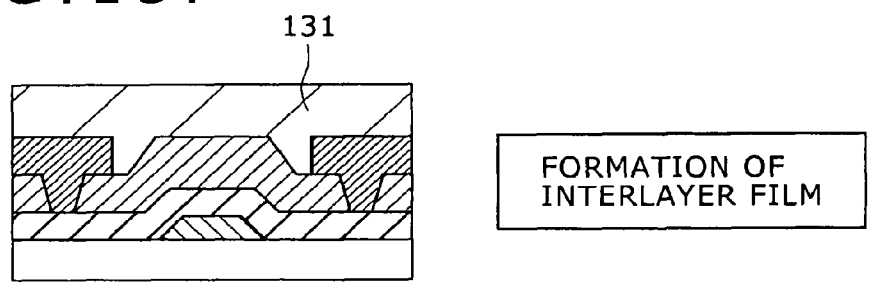

Next, as shown in FIG. 13F, the interlayer film 131 is made of $SiO_2$.

Figure 13G:
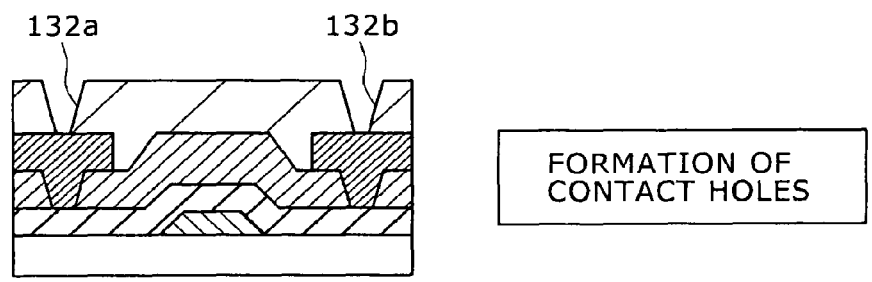

As shown in FIG. 13G, the contact holes 132a and 132b are formed in the interlayer film 131 so as to extend to the drain electrode 129 and the source electrode 130, respectively.

Figure 13H:
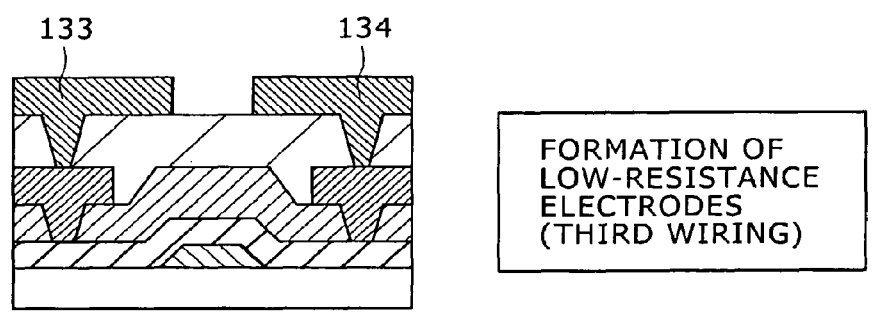

Also, as shown in FIG. 13H, the third wiring layer 133 as the power source line PSL is formed so as to be connected to the drain electrode 129 through the contact hole 132a formed in the interlayer film 131. Also, the third wiring layer 134 for the second electrode is formed so as to be connected to the source electrode 130 through the contact hole 132b formed in the interlayer film 131.

Each of the third wiring layers 133 and 134, for example, can be formed by patterning an aluminum (Al) film, or can also be made of the same material as that of the anode electrode layer 137 formed thereabove, for example, silver (Ag) or the like.

Figure 13I:
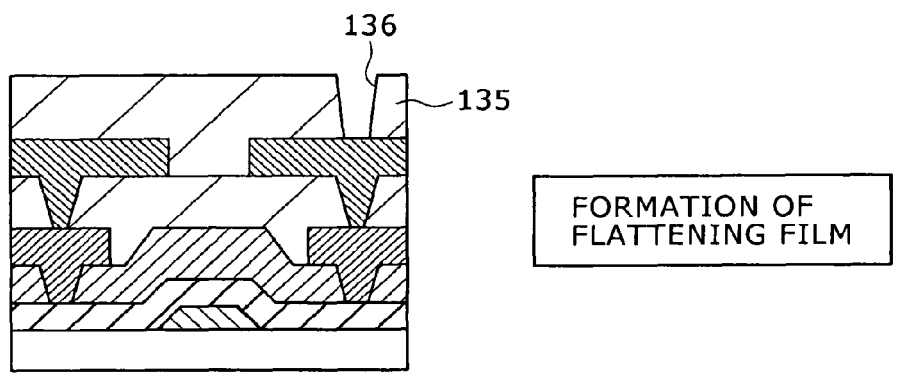

Next, as shown in FIG. 13I, the flattening film 135 is formed so as to cover each of the third wiring layers 133 and 134, and the interlayer film 131. Subsequently, the contact hole 136 is formed in the flattening film 135 so as to extend to the third wiring layer 134.

Figure 13J:
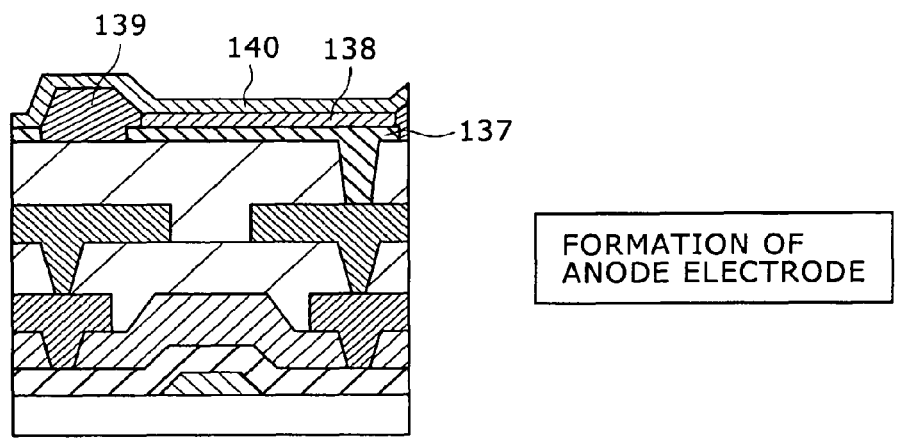

Also, as shown in FIG. 13J, the anode electrode layer 137 of the organic EL light emitting element 113 is formed so as to be connected to the third wiring layer 134 through the contact hole 136 formed in the flattening film 135.

Moreover, the organic EL light emitting element material layer 138 is formed on the anode electrode layer 137. Also, the insulating film 139 is formed on the both sides of the anode electrode layer 137 and the organic EL light emitting element material layer 138, and the cathode electrode layer 140 is formed on the insulating film 139.

Next, the description will now be given with respect to the method of manufacturing the pixel circuit portion in the case where the interlayer film 131 is made of the photosensitive resin with reference to FIGS. 14A to 14I.

Figure 14A:
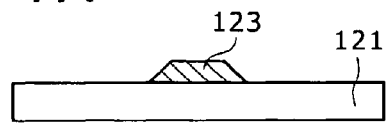
FIGS. 14A to 14I are respectively cross sectional views explaining a manufacturing method when an interlayer film is made of a photosensitive resin.

As shown in FIG. 14A, the gate electrode 123 as the first wiring layer is formed on the transparent insulating substrate (for example, the glass substrate) 121.

As described above, the gate electrode 123 is formed by depositing a metal such as molybdenum (Mo) or tantalum (Ta), or an alloy by utilizing the sputtering method or the like.

Figure 14B:
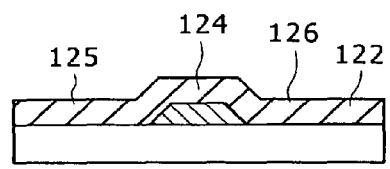

Next, as shown in FIG. 14B, after the gate insulating film 122 is made of $SiO_2$, an amorphous silicon film is deposited and polycrystallized, thereby forming the channel formation region 124, and the n$^+$-type diffusion layers 125 and 126 (the drain diffusion layer and the source diffusion layer).

Figure 14C:
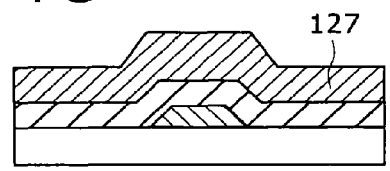

Next, as shown in FIG. 14C, the insulating film 127 is made of $SiO_2$.

Figure 14D:
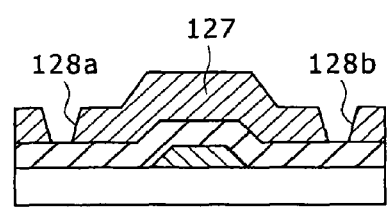

As shown in FIG. 14D, the contact holes 128a and 128b are formed in the insulating film 127 so as to extend to the drain diffusion layer 125 and the source diffusion layer 126, respectively.

Figure 14E:
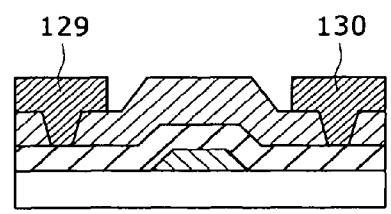

Also, as shown in FIG. 14E, the drain electrode 129 as the second wiring layer for the first electrode is formed so as to be connected to the drain diffusion layer 125 through the contact hole 128a formed in the insulating film 127. Also, the source electrode 130 as the second wiring layer for the second electrode is formed so as to be connected to the source diffusion layer 126 through the contact hole 128b formed in the insulating film 127.

Each of the drain electrode 129 and the source electrode 130, for example, is formed by patterning an aluminum (Al) film having a low resistance.

Figure 14F:
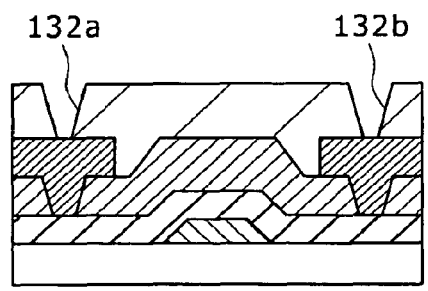

Next, as shown in FIG. 14F, the interlayer film 131 is made of the photosensitive resin. Also, the contact holes 132a and 132b are formed in the interlayer film 131 so as to extend to the drain electrode 129, and the source electrode 130, respectively.

When the interlayer film 131 is made of the photosensitive resin in such a manner, this process can be carried out simultaneously and in parallel to the process for forming the contact holes. As a result, the number of processes can be reduced as compared with the above case where the interlayer film 131 is made of the oxide film. That is to say, the two processes shown in FIGS. 13F and 13G, respectively, can be carried out in one process.

Figure 14G:
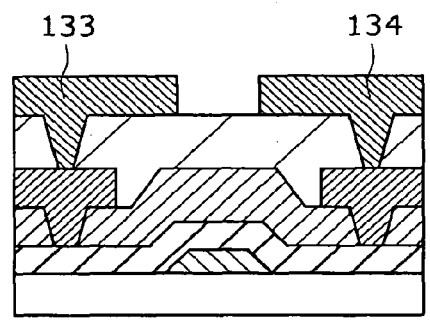

Also, as shown in FIG. 14G, the third wiring layer 133 (or the second wiring layer) as the power source line PSL is formed so as to be connected to the drain electrode 129 through the contact hole 132a formed in the interlayer film 131. Also, the third wiring layer 134 (or the second wiring layer) for the second electrode is formed so as to be connected to the source electrode 130 through the contact hole 132b formed in the interlayer film 131.

Each of the third wiring layers 133 and 134, for example, can be formed by patterning the aluminum (Al) film, or can also be made of the same material as that of an anode electrode layer 137 formed thereabove, for example, silver (Ag) or the like.

Figure 14H:
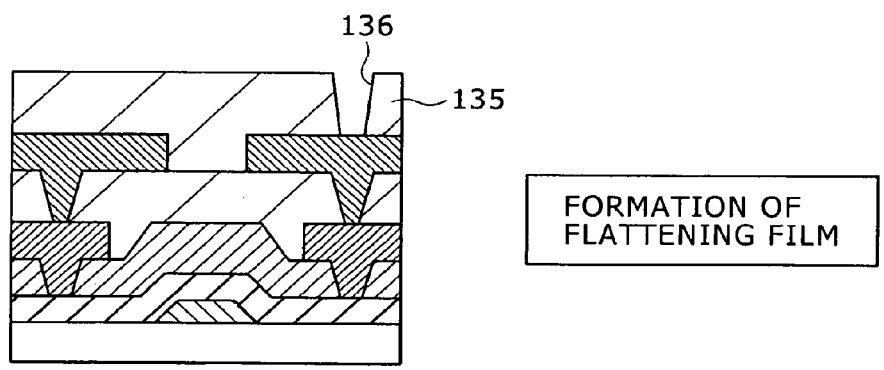

Next, as shown in FIG. 14H, the flattening film 135 is formed so as to cover each of the third wiring layers 133 and 134, and the interlayer film 131. Subsequently, the contact hole 136 is formed in the flattening film 135 so as to extend to the third wiring layer 134.

Figure 14I:
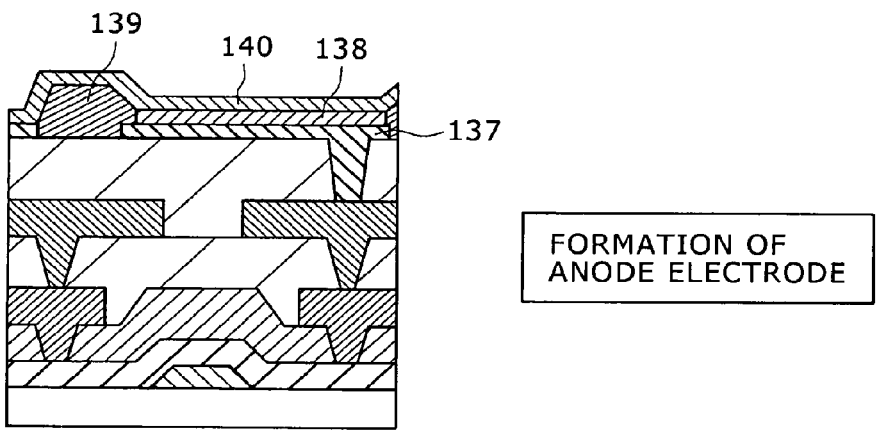

Also, as shown in FIG. 14I, the anode electrode layer 137 of the organic EL light emitting element 113 is formed so as to be connected to the third wiring layer 134 through the contact hole 136 formed in the flattening film 135.

Moreover, the EL light emitting element material layer 138 is formed on the anode electrode layer 137. Also, the insulating film 139 is formed on the both sides of the anode electrode layer 137 and the EL light emitting element material layer 138, and the cathode electrode layer 140 is formed on the insulating film 139.

Next, an operation of the pixel circuit 101 having the above structure will now be mainly described as a more concrete operation thereof with reference to FIGS. 15A to 15E, and FIGS. 16 to 23.

Note that, FIG. 15A shows the gate pulse (scanning pulse) GP which is applied to the scanning line WSL. FIG. 15B shows the power signal PSG which is applied to the power drive line PSL. FIG. 15C shows the input signal SIN which is applied to the signal line SGL. FIG. 15D shows a potential VND112 at the second node ND112. Also, FIG. 15E shows a potential VND111 at the first node ND111.

Figure 16:
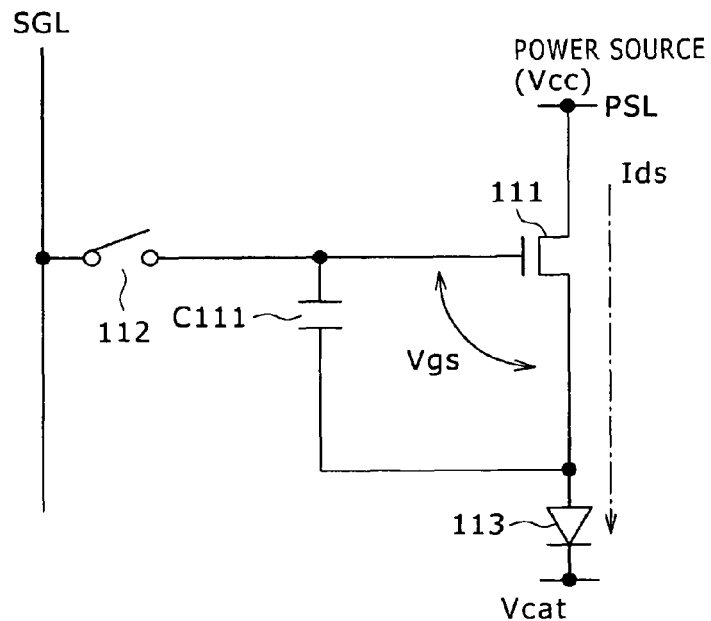
FIG. 16 is a circuit diagram explaining an operation of the pixel circuit shown in FIG. 7, and showing a state of an emission period of time.

Firstly, while the organic EL light emitting element 113 emits the light, as shown in FIG. 15B and FIG. 16, the power drive line PSL is at the power source voltage Vcc, and the n-channel TFT 112 is held in an OFF state.

At this time, the n-channel TFT 111 as the drive transistor is set so as to operate in the saturation region. Thus, the current Ids caused to flow through the organic EL light emitting element 113 gets the value expressed by the expression (1) in correspondence to the gate to source voltage Vgs of the n-channel TFT 111.

Figure 17:
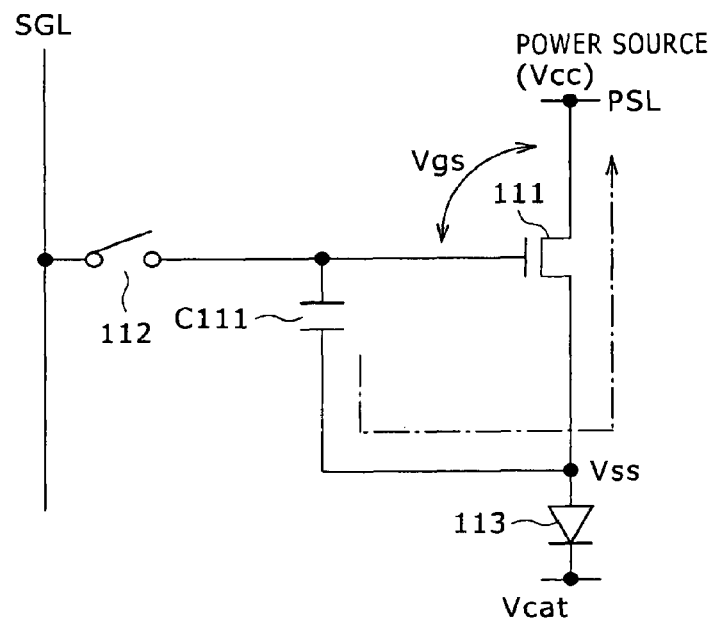
FIG. 17 is a circuit diagram explaining the operation of the pixel circuit shown in FIG. 7, and showing a state in which a voltage of a power drive line is set at a voltage Vss in a nonemission period of time.
Figure 18:
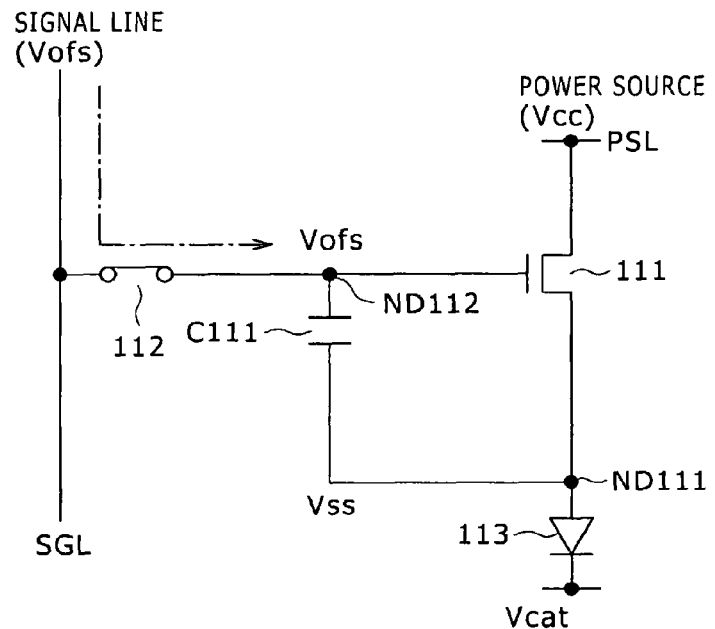
FIG. 18 is a circuit diagram explaining the operation of the pixel circuit shown in FIG. 7, and showing a state in which an offset signal is inputted.

Next, for the nonemission period of time, as shown in FIG. 15B and FIG. 17, the power drive line PSL as the power source line is at the voltage Vss. At this time, when the voltage Vss is smaller than a sum of a threshold Vthel and a cathode voltage Vcat of the organic EL light emitting element 113, that is, a relational expression of (Vss<Vthel+Vcat) is established, the organic EL light emitting element 113 is turned OFF, so that the power drive line PSL as the power source line becomes the source of the n-channel TFT 111 as the drive transistor. At this time, the anode (the first node ND111) of the organic EL light emitting element 113, as shown in FIG. 15E, is charged at the voltage Vss.

Moreover, as shown in FIGS. 15A, and 15C to 15E, and FIG. 18, in a state in which the potential of the signal line SGL is held at an offset voltage Vofs, the gate pulse GP is set at a high level to turn ON the re-channel TFT 112, thereby setting the gate potential of the n-channel TFT 111 at the offset voltage Vofs.

At this time, the gate to source voltage of the n-channel TFT 111 gets a value of (Vofs-Vss). When the gate to source voltage of the n-channel TFT 111 is not larger (lower) than the threshold Vth of the n-channel TFT 111, a threshold correcting operation cannot be carried out. From this reason, the gate to source voltage (Vofs-Vss) of the n-channel TFT 111 needs to be made larger than the threshold voltage Vth of the n-channel TFT 111, that is, the relational expression of (Vofs-Vss>Vth) needs to be established.

Also, in the threshold correcting operation, the power signal PSG which is applied to the power drive line PSL is set at the power source voltage Vcc again.

Figure 19:
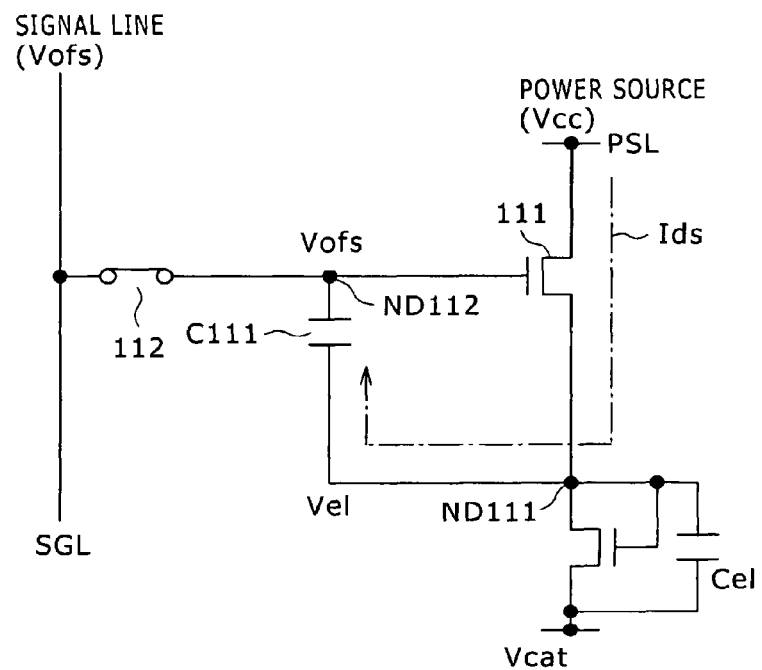
FIG. 19 is a circuit diagram explaining the operation of the pixel circuit shown in FIG. 7, and showing a state in which the voltage of the power drive line is set at a power source voltage Vcc.

Setting the power drive line PSL at the power source voltage Vcc results in that the anode (the first node ND111) of the organic EL light emitting element 113 functions as the source of the n-channel TFT 111, so that the current $I_{ds}$ is caused to flow as shown in FIG. 19.

As shown in FIG. 19, an equivalent circuit of the organic EL light emitting element 113 is expressed by a diode and a capacitor Cel. Therefore, the current caused to flow through the n-channel TFT 111 is used to charge both the capacitors C111 and Cel with electricity as long as a relational expression of Vel≦ Vcat+Vthel (a leakage current of the organic EL light emitting element 113 is considerably smaller than the current caused to flow through the n-channel TFT 111 is fulfilled.

Figure 20:
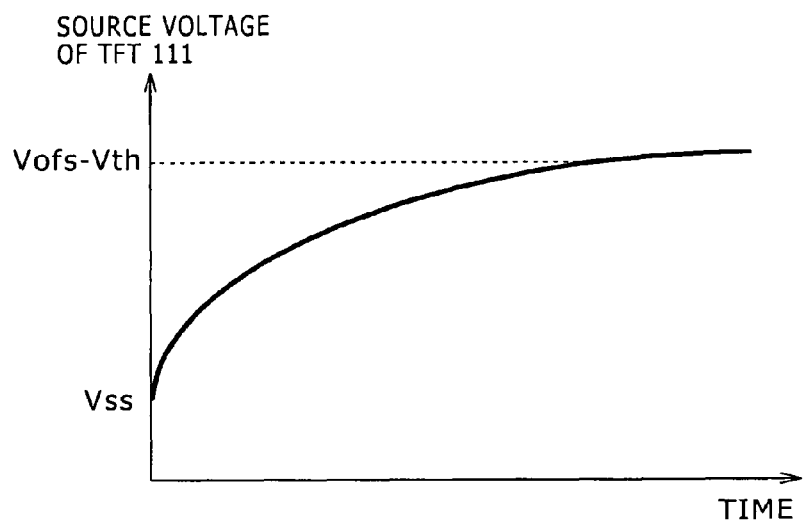
FIG. 20 is a graphical representation explaining the operation of the pixel circuit shown in FIG. 7, and showing transition of a source voltage of a drive transistor when the voltage of the power drive line is set at the power source voltage Vcc.

At this time, a voltage Vel developed across opposite terminals of the capacitor Cel rises with time as shown in FIG. 20. After a lapse of a predetermined time, the gate to source voltage of the n-channel TFT 111 gets a value of the threshold Vth. At this time, a relational expression of Vel=Vofs-Vth≦ Vcat+Vthel is established.

Figure 21:
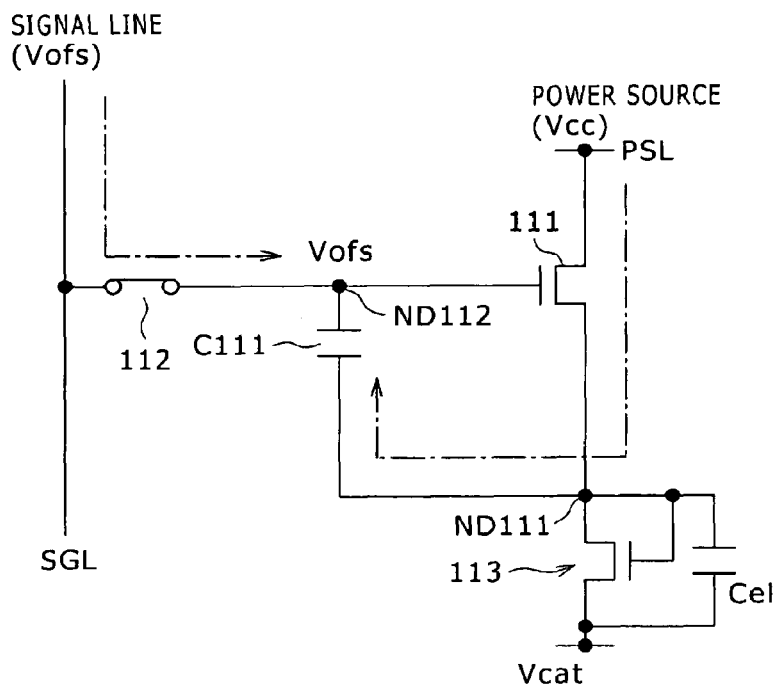
FIG. 21 is a circuit diagram explaining the operation of the pixel circuit shown in FIG. 7, and showing a state when a data signal Vsig is written.

After completion of the threshold canceling operation, as shown in FIGS. 15A and 15C, and FIG. 21, the potential of the signal line SGL is set at Vsig while the n-channel TFT 112 is held in an ON state. The data signal Vsig becomes the voltage corresponding to the gradation. At this time, the gate potential of the re-channel TFT 111 is set at Vsig as shown in FIG. 15D because the n-channel TFT 112 is held in an ON state. However, the source potential of the n-channel TFT 111 rises with time because the current Ids is caused to flow from the power drive line PSL as the power source line into the n-channel TFT 111.

At this time, when the source potential of the n-channel TFT 111 does not exceed a sum of the threshold voltage Vthel and the cathode voltage Vcat of the organic EL light emitting element 113 (the leakage current caused to flow through the organic EL light emitting element 113 is considerably smaller than the current caused to flow through the n-channel TFT 111), the current caused to flow through the n-channel TFT 111 is used to charge both the capacitors C111 and Cel with electricity.

At this time, since the threshold correcting operation for the n-channel TFT 111 is completed, the current caused to flow through the n-channel TFT 111 reflects the mobility μ.

Figure 22:
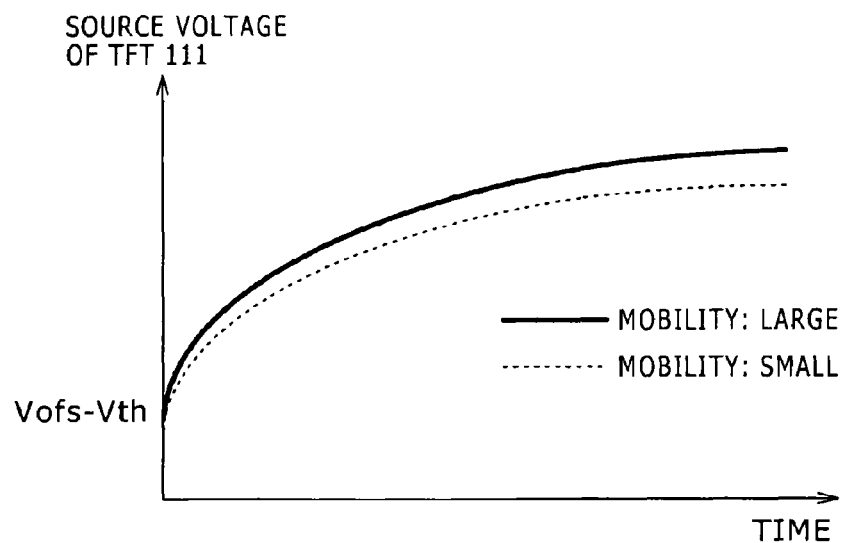
FIG. 22 is a graphical representation explaining the operation of the pixel circuit shown in FIG. 7, and showing transition of the source voltage of the drive transistor corresponding to a magnitude of a mobility.
Figure 23:
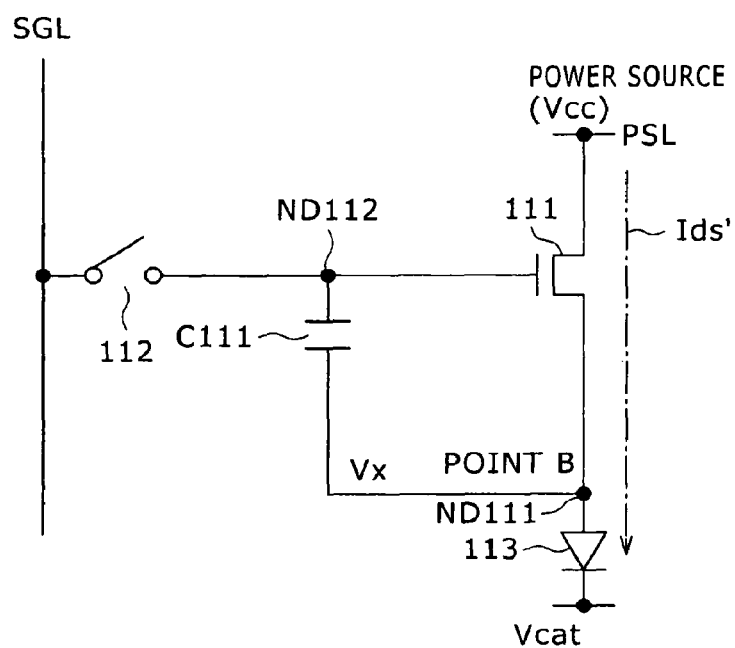
FIG. 23 is a circuit diagram explaining the operation of the pixel circuit shown in FIG. 7, and showing a light emission state.

More specifically, as shown in FIG. 22, an amount of current is large and the source voltage speedily rises as the mobility μ is larger. Conversely, an amount of current is small and the source voltage slowly rises as the mobility μ is smaller. As a result, the gate to source voltage of the n-channel TFT 111 becomes small in a reflection of the mobility μ, and becomes Vgs at which the mobility μ is perfectly corrected after a lapse of a predetermined time.

Finally, as shown in FIGS. 15A to 15C, and FIG. 23, the gate pulse GP is switched from the high level to the low level to turn OFF the n-channel TFT 112, thereby completing the write operation. Thus, the organic EL light emitting element 113 is caused to emit the light.

The gate to source voltage of the n-channel TFT 111 is constant. As a result, the n-channel TFT 111 causes a constant current Ids' to flow through the organic EL light emitting element 113. Also, the voltage Vel developed across the opposite terminals of the capacitor Cel rises to a voltage Vx at which the constant current Ids' is caused to flow through the organic EL light emitting element 113, so that the organic EL light emitting element 113 emits the light.

In this pixel circuit 101 as well, when the emission period of time becomes long, the I-V characteristics of the organic EL light emitting element 113 change. For this reason, the potential at a point B (at the first node ND111) in FIG. 23 changes accordingly. However, since the gate to source voltage of the re-channel TFT 111 is held at a constant value, no current caused to flow through the organic EL light emitting element 113 changes. As a result, even when the I-V characteristics of the organic EL light emitting element 113 deteriorate, no luminance of the organic EL light emitting element 113 changes because the constant current Ids continues to be usually caused to flow.

In the pixel circuit which is driven in such a manner, the power source line is formed in the form of the two level wiring structure to realize the low resistance. As a result, it is possible to improve that the unevenness such as the shading occurs along with the voltage drop to occur in the form of the non-uniformity or the visual surface roughness in the image.

Also, according to this embodiment of the present invention, the display device including the organic electro luminescence (EL) elements is provided with the threshold change correcting function and the mobility change correcting function for the transistor, and the temporal change correcting function for the organic EL light emitting element. Therefore, the high-definition image quality can be obtained. Also, the less number of elements makes it possible to realize the high definition. In addition thereto, the power source line is formed in the form of the multilayer interconnection by using the existing process, which results in that the low resistance wiring can be realized and the excellent image-quality display device can be obtained.

In addition to that the less number of elements makes it possible to realize the high definition, the stepped portion of the opening portion is relaxed by using the less number of wirings, thereby making it possible to reduce the outside light reflected by the surface of the display portion.

Also, in addition to that the less number of elements makes it possible to realize the high definition, the power source line is formed in the form of the multilayer interconnection by making the interlayer film of the photosensitive resin to realize the low-resistance wiring, thereby making it possible to obtain the excellent image-quality display device.

In addition, when the interlayer film is made of the photosensitive resin, the pixel circuit is structured so as to fulfill the relationship of tl=tp/(1+A) (where tp is the thickness of the flattening film, tl is the thickness of the third wiring layer, and A is the constant depending on the interlayer film material). As a result, even when the thickness of the interlayer film is reduced, the multilayer interconnection promotion can be realized without exerting an influence on the coating property of the flattening film.

Figure 24:
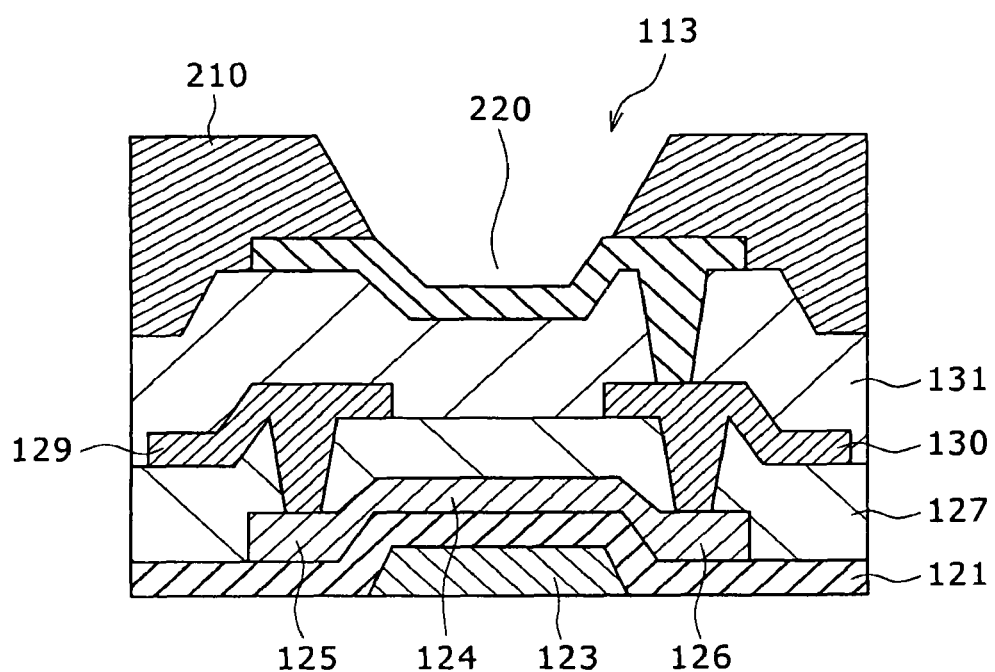
FIG. 24 is a cross sectional view explaining that even when a power source line is not wired in the form of a multilayer interconnection, a stepped portion of a light emitting region of a light emitting element can be relaxed, and an outside light reflected by a surface of a display portion can be reduced.

In this embodiment, the description has been given so far with respect to the case where when the power source line is formed in the form of the multilayer interconnection, the outside light reflected by the surface of the display portion can be reduced by relaxing the stepped portion of the opening portion. In this case, however, as shown in FIG. 24, even when no power source line is formed in the form of the multilayer interconnection, the wiring layers, such as the signal lines SGL, intersecting perpendicularly one another are wired so as not to overlap in the direction of lamination of the layers of the light emitting region. As a result, the stepped portion of the opening portion can be relaxed, and thus the outside light reflected by the surface of the display portion can be reduced.

It should be understood by those skilled in the art that various modifications, combinations, sub-combinations and alterations may occur depending on design requirements and other factors insofar as they are within the scope of the appended claims or the equivalents thereof.

What is claimed is:

1. An organic EL display device comprising a display panel including:
   a semiconductor layer made of a semiconductor material, and the semiconductor layer comprising a channel portion, a first terminal portion, and a second terminal portion of a transistor;
   a first conductor layer made of a first material, and the first conductor layer comprising a control terminal portion of the transistor;
   a second conductor layer made of a second material, and the second conductor layer comprising a data signal wiring, a first conductive portion, and a second conductive portion, each of the data signal wiring, the first conductive portion, and the second conductive portion being arranged independently from each other; and
   a third conductor layer made of a third material, and the third conductor layer comprising a third conductive portion and fourth conductive portion, the third conductive portion being arranged independently from the fourth conductive portion,
   wherein,
   a first contact region connects the first terminal portion and the first conductive portion
   a second contact region connects the second terminal portion and the second conductive portion,
   a third contact region connects the first conductive portion and the third conductive portion,
   a fourth contact region connects the second conductive portion and the fourth conductive portion,
   the third contact region overlaps with the first contact region,
   the fourth contact region overlaps with the second contact region,
   the data signal wiring extends to a first direction,
   the third conductive portion extents to a second direction different with the first direction,
   the data signal wiring overlaps with a light emission region of an organic EL element, and
   the data signal wiring crosses the third conductive portion outside of the light emission region of the organic EL element.

2. The organic EL display device according to claim 1, wherein the third conductive portion does not overlap with a light emission region of the organic EL element.

3. The organic EL display device according to claim 1, wherein the first material includes molybdenum, the second material includes aluminum, and the third material includes silver.

4. The organic EL display device according to claim 3, wherein the semiconductor material includes poly-silicon.

5. The organic EL display device according to claim 1, wherein the transistor is configured to control a current supply.

6. The organic EL display device according to claim 1, wherein the third conductive portion is configured to supply a voltage for non-emission period of the organic EL element.

7. The organic EL display device according to claim 1, wherein the second conductor layer is upper than the first conductor layer, and the third conductor layer is upper than the second conductor layer.

8. The organic EL display device according to claim 1, wherein the semiconductor layer is upper than the first conductor layer.

9. The organic EL display device according to claim 1, wherein,
- the third conductive portion does not overlap with a light emission region of the organic EL element,
- the second conductor layer is upper than the first conductor layer,
- the third conductor layer is upper than the second conductor layer,
- the first material includes molybdenum,
- the second material includes aluminum,
- the third material includes silver, and
- the semiconductor material includes poly-silicon.

* * * * *